United States Patent

[11] 3,615,454

[72] Inventors Lawrence Anthony Cescon; Robert L. Cohen; Rolf Dessauer, all of Wilmington, Del.

[21] Appl. No. 740,103
[22] Filed June 26, 1968
[45] Patented Oct. 26, 1971
[73] Assignee E. I. du Pont de Nemours and Company Wilmington, Del.

[54] PROCESS FOR IMAGING AND FIXING RADIATION-SENSITIVE COMPOSITIONS BY SEQUENTIAL IRRADIATION
27 Claims, No Drawings

[52] U.S. Cl. .......... 96/35.1, 96/48, 96/115 P, 250/65, 250/65.1, 204/159.22, 204/159.23
[51] Int. Cl. .......... G03c 5/24
[50] Field of Search .......... 96/48, 35.1, 115 P; 204/159.22, 159.23; 250/65, 65.1

[56] References Cited

UNITED STATES PATENTS

| | | | |
|---|---|---|---|
| 3,056,673 | 10/1962 | Wainer | 96/48 |
| 3,479,185 | 11/1969 | Chambers | 96/115 X |
| 3,484,238 | 12/1969 | Fox | 96/48 X |

FOREIGN PATENTS

| | | | |
|---|---|---|---|
| 1,047,569 | 11/1966 | Great Britain | 96/48 |

*Primary Examiner*—George F. Lesmes
*Assistant Examiner*—R. E. Martin
*Attorney*—Gary A. Samuels

ABSTRACT: A multiple irradiation method which comprises providing a radiation-sensitive material comprising (1) a radiation-sensitive, multicomponent, intermolecularly reactive imageable composition whose imaging reaction is subject to diffusion control, mixed with (2) a radiation-sensitive polymerizable composition, imaging by irradiating with imaging radiation under imaging conditions, and deactivating the imageable composition in the unexposed areas by irradiating with the polymerizing radiation under nonimaging conditions, said polymerization being effective to rigidify the material so as to render the imaging reaction diffusion-controlled and thereby prevent the imaging components from diffusing together and reacting.

In the imaging step it is only necessary that the imaging reaction occur before the polymerization reaction can deactivate the system. In the deactivation (or fixing) step it is only necessary that the deactivating radiation be applied under conditions ineffective for imaging.

Imagewise exposing the composition first to the imaging radiation then to the deactivating radiation produces a negative image. On the other hand, imagewise exposing the composition first to the deactivating radiation creates a latent image, which is developed by exposing the unirradiated areas to the imaging radiation.

PROCESS FOR IMAGING AND FIXING RADIATION-SENSITIVE COMPOSITIONS BY SEQUENTIAL IRRADIATION

BACKGROUND OF THE INVENTION

1. Description of the Invention

This invention relates to a multiple exposure irradiation method for producing fixed images.

More specifically, the invention is directed to a multiple exposure irradiation method for producing fixed images which utilizes radiation-sensitive materials containing (1) intermolecularly reactive components for producing a characteristic readout product under one set of irradiation conditions and (2) polymerizable components for producing rigidifying polymer under another set of irradiation conditions effective for polymerization but ineffective for producing the readout product, and comprises the steps of producing readout product under the one set of conditions and polymerizing without substantially producing readout product under the other set of conditions. The polymerized matrix immobilizes the reactive components which produce the readout product, thus preventing them from diffusing together and reacting when the composition is subsequently exposed to the readout product-producing radiation. The composition is thus deactivated (or fixed) and the mage as represedted by the actual or potential difference in readout product concentration between the sequentially exposed areas) is fixed.

2. Description of the Prior Art

Various radiation-responsive imaging systems produce a colored or other characteristic readout product through intermolecular reactions of two or more reactive components. Expedients suggested for deactivating such imaging systems in the unexposed areas, thereby fixing the image, include (1) removing one or more of the imaging components, as by volatilization (U.S. Pat. No. 3,042,515) or polymerization (U.S. Pat. No. 3,056,673) (2) volatilizing a plasticizing solvent (British Pat. No. 1,047,569), (3) incorporating a deactivating agent into the unexposed area to be fixed, as by spraying, dipping or coating (British Pat. No. 1,047,569), and (4) generating a deactivating agent in situ, including photochemically (British Pat. No. 1,057,785).

British Pat. No. 1,057,785 discloses a sequential irradiation image-fix system involving a photooxidant/leuco dye imaging combination that produces a colored image at one wavelength and a second photooxidant/reductant combination that produces a deactivating agent for the imaging photooxidant at a second wavelength.

Wainer, U.S. Pat. No. 3,056,673, also discloses a sequential irradiation image-fix method in which organic halogen/N-vinylamine compositions undergo two distinct photochemical reactions, both involving the vinylamine. One at long wavelengths leads to color (subsequently developed by heating); the other at short wavelengths polymerizes the vinylamine. Polymerizing the amine in the uncolored area fixes the colored image by removing the vinylamine, thus making it unavailable for color formation, its polymer being inactive in the color-forming reaction. This system discloses only compositions of halogen compounds that yield free radicals at spectral ranges above 360 mu and selected vinylamines such as N-vinyl carbozole.

Belgian Pat. No. 681,944 describes photopolymerizable compositions containing a hexaarylbiimidazole, an electron donor which may be a leuco dye, an addition-polymerizable monomer, and optionally containing an energy transfer dye to extend the compositions's spectral sensitivity from ultraviolet to visible light and an oxygen scavenger. In other words, it discloses that the biimidazole/leuco dye imaging components of British Pat. No. 1.047,569 can photoinitiate addition-polymerizations. The energy transfer dye and the oxygen scavenger correspond to the photoreducible dye/mild reducing agent combination which Oster U.S. Pat. No. 2,840,445 discloses as phot lym ization initiators. Thus the Belgian Patent actually discloses two photopolymerization initiator systems in combination, biimidazole/leuco dye activatable in the UV and photoreducible dye/mild reducing agent activatable in the visible. The patent describes that images produced by imagewise exposing the disclosed compositions to light (UV or visible) are developed by suitable means —which exploit differences in the physical and chemical properties of the exposed and unexposed areas, such as preferentially incorporating a characterizing dye or pigment into the underexposed areas, transferring still tacky underexposed areas to another substrate, or washing out the underexposed areas —to produce either images on receptors or reliefs suitable for printing. The patent, however, does not disclose or suggest multiple exposure irradiation of any of the imageable and photopolymerizable compositions such that the color- and polymer-producing reactions can be controlled.

In summary, the prior methods for producing fixed images are not entirely satisfactory in one or more respects. They tend to be limited as to the compositions that may be used, or they subsequently require special mechanical handling or chemical treatment of the radiation-exposed compositions, or, where sequential irradiation may be used, they require either different radiation sources providing, for example, different wavelength ranges or a single wide wavelength radiation source with filters.

SUMMARY OF THE INVENTION

A method for producing and fixing an image which comprises

A. providing a layer of a radiation-sensitive image recording material comprising 1. a multicomponent, intermolecularly reactive imageable composition comprising
   a. a first reactant (preferably devoid of addition-polymerizable ethylenic unsaturation),
   b. a second reactant precursor activatable to a second reactant by a first hereinafter called imaging (or readout product producing-) radiation, said first reactant being intermolecularly re active with the second reactant to produce a characteristic readout product, the greater the concentrations that diffuse together and react the greater the concentration of the readout product produced, said first reactant and precursor being present in an amount sufficient to produce said product in a substantial readout amount when the precursor is activated,
2. an ethylenically unsaturated addition-polymerizable monomer which is different from said first reactant of the imageable composition, is a plasticizer for the imageable composition, and is polymerizable to a substantially rigid polymer when the radiation-sensitive material is irradiated with a second hereinafter-called fixing or deactivation radiation (or latent-imaging radiation when imagewise applied) said monomer being present in such amount that
   i. the radiation-sensitive material, with the monomer substantially unpolymerized, is sufficiently fluid to allow the first reactant and the second reactant when generated by said imaging radiation to diffuse together and produce a readout amount of said readout product, and
   ii. the radiation-sensitive material is substantially rigidified when the monomer has been substantially converted to its polymerized form and the diffusion of said reactants is substantially retarded therein, and
3. an addition-polymerization initiator which is activatable by said fixing radiation, may be the same as or different from the second reactant precursor, and when the same as that precursor is further characterized in that the greater the exposure to the imaging radiation, i.e., the greater it intensity and/or the longer the exposure time, the greater the proportion of said initiator that is activated (as judged by increased readout product formation at increased intensities and exposures), and optionally and preferably a polymeric binder transparent to the imaging and fixing radiation, B. exposing the radiation-sensitive material to said imaging radiation and to said fixing radiation, in any order, with one applied patternwise, 1. the imaging step comprising irradiating the material with said imaging radiation sufficient in intensity and exposure time to liberate said second reactant in an amount sufficient to produce a readout amount of said readout product in the exposed areas,
2. the fixing step comprising irradiating with said fixing radiation such the the polymerizable monomer is polymerized substantially without effecting the reaction of the first and second reactants, thereby producing rigidified areas that contain less of the readout product than the areas exposed to the imaging radiation, the area thus exposed being substantially fixed in that, owing to the substantially decreased diffusion of the first and second reactants in the rigidified area, readout product formation is substantially prevented when such area is subsequently reexposed to the imaging or fixing radiation, and with the provisos
   a. when the imaging radiation is also effective for said polymerization, the components of the radiation-sensitive material and the imaging exposure conditions are selected such that the readout product formation rate is sufficiently fast relative to the polymerization rate to produce a readable amount of the readout product, and
   b. when the fixing radiation is also effective to activate the second reactant precursor, the components and the fixing exposure conditions are chosen such that the polymerization proceeds to said fixing extent before substantial readout product formation occurs, and C. reading out the image in terms of the difference in readout product concentration between the imaged and fixed areas.

The imaging and fixing radiations need not be the same; they may, for example, differ as to type, intensity or energy content. Examples of radiation types include those wherein:

The second reactant precursor is activatable by actinic radiation, the polymerization initiator by heat, The second reactant precursor is activatable by actinic radiation, the polymerization initiator by an electron beam.

Preferably, the steps are carried out sequentially in which the first step is applied patternwise.

As can be seen by the foregoing Summary and Description of the Prior Art, the objects of this invention are:

1. to provide a novel and versatile multiple-exposure irradiation method for activating and deactivating intermolecularly reactive multicomponent imaging systems wherein deactivating the imaging system to fix the image involves polymerizing an addition-polymerizable component which is not an imaging reaction component;

2. to provide a noncontact image-fix method whereby information as a first radiation can be recorded patternwise and fixed by a second radiation in an essentially dry process which does not require mechanical or chemical aftertreatment to produce or fix the image.

3. to provide such method wherein the applied imaging and fixing radiations may be actinic radiations, infrared radiations, electron beams, X-rays, or other activating electromagnetic radiations differing as to type, wavelength, intensity, or other measure of energy content;

4. to provide such method utilizing actinic radiations differing in intensity or exposure time; and 5. to provide such method which affords fast imaging and fast fixing for quick image accession, good contrast between imaged and fixed areas, high resolution, good resolution retention, and general high resistance to mechanical deformation, abrasion, atmospheric conditions, solvents and other chemical agents.

These and other objects will become apparent as described hereinafter.

DESCRIPTION OF THE INVENTION

A. Definitions Used Herein

By "imaged area" is meant one that has been exposed to the imaging radiation to the extent needed to produce therein a detectable concentration of the readout product.

By "deactivated area" is meant one that has been exposed to the deactivating radiation to the extent needed to rigidify the composition such that subsequent exposure to the imaging radiation yields a substantially lesser amount of the readout product that the amount produced on first exposing the radiation-sensitive material to the imaging radiation.

By a "substantially lesser amount of readout product" is meant a difference in concentration or density, such as optical density, between adjacent imaged and fixed areas detectable by a physical readout means as more fully described below.

The term "radiation-sensitive materials" refers to the material employed in the process as a whole, and may sometimes be called "image-fix material" or "image-fix composition."

The term "radiant energy," as used herein, includes not only the ultraviolet and visible regions (i.e., actinic radiation) and infrared region of the electromagnetic spectrum, but also electron beams such as developed by cathode ray guns, also gamma rays, X-rays, beta rays, electrical corona discharge, and other forms of corpuscular and/or wavelike energy generally deemed to be radiant energy.

The "radiant enrgy" which makes up the "imaging and fixing radiations" may be the same or different, and each may differ as to type, intensity or energy content. It will be understood of course that the choice of radiant energy for imaging and fixing will depend on the image-fix compositions employed. Preferred "imaging and fixing" radiations include imaging and fixing activated by actinic radiation, thermal energy or electron beams. Some specific preferred imaging/fixing radiation combinations include actinic/actinic, where the actinic radiations differ in intensity, wavelength or exposure time; intense electron beam/weak electron beam; actinic/heat; actinic/electron beam; actinic light/X-ray and electron beam/X-ray.

B. Operation of the Process

One feature of this invention is based on the discovery that intermolecularly reactive imaging compositions can be deactivated by immobilizing them in a rigid polymeric matrix, i.e., in the fixing step, addition polymerization is relied upon to convert a relatively fluid imaging material to a highly viscous, substantially rigid mass. This immobilization or rigidification is initiated by irradiation and can be carried out either before or after the imaging irradiation step. If the imaging step is carried out first, a negative-working image is produced, i.e., corresponding to the pattern of the radiation. If the deactivating or fixing step is carried out first, a latent image is produced which is developed by exposing the unfixed areas to the irradiation of the imaging step.

Thus, the radiation-sensitive material utilized in this invention may be regarded as comprising two radiation-activatable systems, one intermolecularly producing readout product in readable concentrations under imaging radiant energy conditions; the other addition-polymerizably producing a polymerized matrix under deactivating radiant energy conditions, the polymerized matrix serving to immobilize and thereby deactivate or fix the readout producing system to prevent further formation of readout product.

Intermolecular reactions are inherently subject to diffusion control. This is because their experimental rate constants include terms describing both diffusion and chemical processes. Normally in fluid media reactants diffuse together faster than they react so that the chemical step (product formation) is rate-determining. The diffusion step can be made slower than the chemical step by changing the viscosity, as by converting the medium to a glass or gel, so that the chemical change occurs only as fast as the reactants diffuse together. In accord with the above, the components of the image-fix compositions are chosen such that initially with the monomer substantially unpolymerized, and also during the imaging exposure, when the monomer may be in part polymerized, the compositions are sufficiently fluid to produce a readable concentration of the readout product in a reasonable time commensurate with the utility for which they are designed. The polymerizable components used herein are preferably liquid and serve to plasticize the initially formulated image-fix composition and allow substantially unimpeded diffusion therein. Since intermolecular reaction rates for readout product formation are proportional to the product of the concentrations of the reactants that diffuse together, the composition should contain relatively high concentrations of the first reactant and the second reactant precursor. To produce relatively high concentrations of the readout product, the imaging conditions should suffice to release relatively high concentrations of the second reactant substantially immediately, while the diffusion rate is still fast and the chemical step for readout product formation is still rate limiting.

The fixing conditions on the other hand should so increase the viscosity of the composition that reactant diffusion becomes so slow that the thus exposed composition is effectively deactivated against further imaging. A feature of this invention is that the necessary viscosity increase can be effected through addition-polymerizations without releasing substantial proportions of the second reactant, so that the polymerized and deactivated area contains a lesser quantity of the readout product than the imaged area.

Another feature of the process of this invention is that the intermolecularly reactive components (or imaging components) react upon treatment with the imaging irradiation and form an "imaged" product (or "readout" product) which differs from the reactive components in at least one measurable parameter (herein called "readout" property) that is normally associated with the formation of the readout product and is readable by physical means.

The readout property may characterize the starting materials or the imaging reaction products or both, and may be electromagnetic, magnetic, electrical, electrochemical or thermal. Thus the image may be read in terms of such electromagnetic properties as absorption, emission, refraction, rotation, reflection and scattering of ultraviolet, visible and infrared radiation. The imaged and nonimaged, including fixed, areas may differ in their ultraviolet, visible or infrared absorption spectra, fluorescent, visible or infrared absorption spectra, fluorescent or phosphorescent spectra, index of refraction, or optical rotation (resulting, for example, from the racemization of or inversion of an optically active imaging reactant or the formation of an optically active product through a stereoselective intermolecular imaging reaction.) The imaged and nonimaged areas may differ in magnetic properties associated for example with a change in the valence state or coordination number of a magnetic transition metal; or, they may differ in electrical or thermal conductivity resulting from the conversion of a metallic compound to the free metal; or, they may differ in such electrochemical properties as electrolytic conductivity owing to electrolyte concentration changes or oxidation reduction potentials owing to valence state changes, such changes and differences between imaged and nonimaged areas being detectable with probe electrodes.

While the readout property need not be apparent to the naked eye, this invention will be more specifically illustrated below with compositions that depend for imaging on the formation of colored readout products, for example, visible light-absorbing dyes. More particularly, the invention will be described and illustrated with reference to imaging systems comprising leuco dyes [the first reactant (1) in the Summary] and activatable oxidants therefor [the second (*b*) reactant precursor (1)], particularly oxidants activatable by light, heat or an electron beam, especially light.

C. Embodiments of the Invention

The several embodiments of the invention vary according to the specific types of imaging and fixing irradiation employed. As previously stated, the types of irradiation useful in the irradiation steps of this invention include actinic radiation, infrared radiation, electron beam radiation, X-ray radiation and the like. In addition, the several embodiments vary according to the components present.

In a preferred embodiment, one compound acts as both the second reactant precursor (1) (*b*) and the addition-polymerization initiator (3). In these instances, both the imaging step and the fixing step are dependent upon the irradiation exposure or wavelength given the imaging and fixing components. "Irradiation exposure" as used herein is a function of the intensity of the radiation and length of time of irradiation.

(1) Irradiation Exposure Embodiments

Referring now the description of the invention set forth in the first paragraph of the Summary, this exposure-dependent embodiment of the invention comprises a method as set forth in the Summary in which the polymerization initiator (3) and the second reactant precursor (1) (*b*) are the same, the fixing radiation exposure differs from the imaging radiation exposure and is less effective than the imaging exposure for producing the readout product, and the fixing step (B) (2) comprises irradiating at an exposure (i.e., at an intensity and for a time) sufficient to produce said polymer in a rigidifying amount but insufficient relative to the imaging step radiation exposure to produce said readout product.

Since exposure is dependent upon the intensity of the radiation and the length of time of irradiation, the exposure-dependent embodiment can be divided into two subembodiments,—one being an embodiment in which the imaging composition is activated at one intensity, while the fixing component is activated by a different intensity; and one being an embodiment in which the activation of the imaging composition and the fixing component depends upon the length of time of irradiation.

The first, the intensity-dependent method, comprises a method as set forth in the Summary in which the polymerization initiator (3) and the second reactant precursor (1) (*b*) are the same and are intensity-respondent;

the imaging step comprises irradiating with a relatively intense radiation for a time sufficient to activate a relatively large proportion of said second reactant precursor, thereby producing an area containing a relatively high, readable concentration of said readout product;

the fixing step (B) (2) comprises irradiating with a fixing radiation substantially less intense than the imaging radiation for producing the readout product but sufficiently intense to substantially completely polymerize the monomer, thereby producing a rigidified area that contains a substantially lesser amount of the readout product than the imaged area and is substantially deactivated against readout product formation when the thus-fixed area is subsequently exposed to the imaging radiation of step (B) (1).

The second, the time-dependent method, comprises a method as set forth in the Summary in which the polymerization initiator (3) and the second reactant precursor (1) (*b*) are the same and are intensity-responsive, the imaging and the fixing radiations are sufficiently intense to produce readout product, and where the imaging and fixing exposures differ in that fixing involves irradiating for a shorter time so as to produce a deactivated area containing a lesser amount of the readout product than the imaged area.

Preferred compositions and components employed in the foregoing intensity-dependent or the time-dependent exposure embodiments are as follows:

the first reactant (1) (*a*) is a leuco dye oxidizable to a dye, preferably an aminotriarylmethane as a salt of a strong acid, particularly wherein at least two of the aryls bear a tertiary amino group and a selected substituent ortho to the methane carbon, as further described below;

the second reactant precursor (1) (*b*) is a hexaarylbiimidazole that is activatable by light, heat, X-rays or an electron beam, and also acts as the polymerization initiator (3). Preferably it is photodissociable substituted hexaphenylbiimidazole having o-substituted phenyls at the 2- and 2′-positions, as further described below;

the monomer (2) contains at least one addition-polymerizable, terminally unsaturated ethylenic group and preferably contains at least two such groups and is an alpha-methylene carboxylic ester of an aliphatic polyol, particularly an acrylate as further described below.

Particular combinations of types of irradiation preferred for use in the imaging and fixing irradiation steps of these exposure-dependent embodiments are as follows:

where both the imaging and fixing steps involve actinic exposures differing in intensity or exposure time;

where both the imaging and fixing radiations are infrared, the first corresponding to an imaging temperature T*i*, the second to a fixing temperature T*p* (a lower temperature than and less effective than Ti for producing readout product, the imaging step comprising heating at T*i*, and the fixing step comprising heating at T*p*;

where both the imaging and fixing steps involve electron beam exposures differing in intensity or exposure time;

where the second reactant precursor is activatable for imaging and fixing by actinic radiation and is activatable for fixing by infrared radiation, the imaging comprising exposing the image-fix composition to said actinic radiation, and the fixing comprising simultaneously exposing the composition to a fixing intensity of the actinic radiation and to a fixing temperature for a time sufficient to deactivate the imaging system.

2. Irradiation Wavelength Embodiments

Referring again to the description of the invention set forth in the first paragraph of the Summary, the wavelength-dependent embodiment of the invention comprises a method as set forth in the Summary in which the imageable composition (1) and the addition-polymerizable monomer (2) are each activated by radiation of a specific wavelength;

the polymerization initiator (3) is activated by radiation of a different wavelength than the imaging radiation, and when so activated, is substantially less effective for producing the readout product than the second reactant precursor (1) (*b*) when it is activated by the imaging radiation, said fixing radiation wavelength being less effective than the imaging radiation for activating the second reactant precursor.

The wavelength-dependent embodiment can also be divided into two subembodiments. One subembodiment is an embodiment in which the polymerization initiator (3) is the same as the readout second reactant precursor (1) (*b*) and has a region of major actinic radiation absorption (e.g., in the UV) and a region of minor actinic radiation absorption (e.g., in the visible region); and in which imaging involves irradiating into the major region (with or without simultaneously irradiating into the minor region) for a time and intensity sufficient to produce the readout; while fixing involves irradiating into the minor region only, for a time and intensity sufficient to deactivate the composition substantially without readout formation.

The second subembodiment is one in which the polymerization initiator (3) differs from the readout second reactant precursor (1) (*b*) and it has an actinic radiation absorption region that corresponds to nonimaging wavelengths (i.e., wavelengths ineffective to activate the second reactant precursor).

Preferred components and wavelengths employed in the first of the foregoing wavelength-dependent subembodiments are as follows:

the first reactant (1) (*a*) is a leucodye oxidizable to dye, preferably an aminotriarylmethane as a salt of a strong acid, particularly wherein at least two of the aryls bear a tertiary amino group and a selected substituent ortho to the methane carbon, as further described below, the second reactant precursor (1) (*b*) is a hexaarylbiimidazole activatable by light and also acts as the polymerization initiator (3) (preferably, it is a photodissociable substituted hexaphenylbiimidazole having o-substituted phenyls at the 2- and 2′-positions, as further described below, and has major light absorptivity for imaging in the 250–370 $\mu$ region and substantially lower absorptivity in the 400–430 $\mu$ region for fixing), the monomer (2) contains at least one addition-polymerizable, terminally unsaturated ethylenic group and preferably contains at least two such groups and is an alpha-methylene carboxylic ester of an aliphatic polyol, particularly an acrylate as further described below.

Preferred compositions and wavelengths employed in the second of the foregoing wavelength-dependent subembodiments is one in which the first reactant (1) (*a*), the second reactant precursor (1) (*b*) and the polymerization-monomer (2) are of the same class of compounds as described in the preceding paragraph, but in which the polymerization initiator (3) is different from the second reactant precursor and is either a polynuclear quinone absorbing principally in the 430–550 $\mu$ region, and minimally or not at all below 400 $\mu$, or a photoreducible visible light absorbing dye which is a polymerization initiator for said monomer. Preferably, such polymerization initiator is in combination with a chain transfer agent for the polymerization reaction which is inert to the polymerization initiator in the absence of the activating fixing radiation and is capable of reducing the quinone to the corresponding hydroquinone or of bleaching the dye when, in the absence of the monomer, the composition is irradiated with the fixing radiation. In contrast to the exposure-dependent embodiments which depend on control of the intensity or time of the activating radiation, these wavelength-dependent embodiments utilize a relatively lowly populated absorption band of the precursor to limit the number of activated molecules, or else involve a substantially independent (nonimaging) polymerization system. In the latter, the fixing band's extinction coefficient may be as high as or higher than the second reactant's band. It is desirably high for most rapid fixing. D. Theory of the Invention When the second reactant precursor (1) (*b*) is also a polymerization initiator, as in the preferred embodiments, readout product and polymer formation proceed simultaneously during both the imaging and fixing steps. Operability and process control here derive from the facts that (1) imaging involves essentially a bimolecular or higher order reaction, (2) fixing involves essentially a chain reaction which is first order in the polymerization initiating species, and (3) the nature, wavelength, intensity and exposure duration of the deactivating or fixing radiation determine the number of reactant molecules activated for participation in these reactions. For example, photoactivated intermolecular imaging reactions are inherently limited to quantum efficiencies of about one. The number of readout product molecules produced is thus roughly about the same order of magnitude as the number of photons absorbed, and relatively many photooxidant (second reactant precursor) molecules must be activated to produce readable amounts of the readout product. In contrast, the quantum efficiency of addition-polymerizations is practically unlimited; the number of monomer molecules incorporated into the polymer chain can be very large per photon absorbed, on the order of 10,000 or more. Thus, relatively few polymerization initiator molecules (e.g., on the order of $10^{18}$ molar) need be activated to efficiently polymerize the monomer and rigidify the system substantially without producing readout product.

To produce concentrations of activated imaging reactants high enough to yield readout concentrations of the readout product, the activating radiation should be sufficiently intense (i.e., the amount of energy delivered per unit time should be adequate) to activate the requisite number of imaging reactant molecules in the allotted exposure time. The imaging components should of course be such that the readout product formation rate, which depends on the reaction rate constant and reactant concentrations, is fast enough to produce the readout product in readable amounts before the concurrent viscosity-increasing polymerization reduces the imaging reaction rate constant to the point where image formation is effectively stopped. For a given imaging system and activating radiation there is a threshold intensity that must be exceeded if imaging is to occur before the reaction becomes diffusion-controlled. Thus the intensity and exposure time required for imaging varies not only with the imaging components but also with the polymerization system and how fast it can render the imaging reaction diffusion controlled at a particular exposure.

Where both the imaging and polymerization reactions can occur simultaneously, the imaging reaction can be rendered diffusion-controlled even sooner than normal and thus concurrent readout product formation further minimized during the fixing step, by incorporating viscosity increasing binders and fillers into the initial image-fix compositions. Such material should not however so rigidify the initial image-fix composition as to prevent the formation of readable images during the imaging step. Further, as indicated above, the polymerizable compound, the initiator, binder, and auxiliary components will be chosen with due regard to the polymerization reaction as a competitive reaction during the imaging step. Polymer initiation and propagation should not be so fast as to result in complete matrix rigidification before the readout product has formed to the desired extent. Thus while a rapid fixing capability is usually desirable, it is often advantageous, where maximum readout densities are desired, that the polymerization reaction undergo a slight induction period during which time the diffusion rate remains high enough to allow readout product formation to proceed at a high rate unimpeded by polymerization-induced viscosity increase. It is therefore within the scope of this invention to regulate the speed of the polymerization reaction, particularly during the early stages of the imaging exposure, by incorporating small amounts of inhibitors sufficient to provide a slight induction period. Atmospheric oxygen is particularly effective for this purpose.

Of course, the retarding effect of the polymerization reaction on the imaging reaction rate may be avoided during the imaging step by employing radiation effective for activating the imaging system only.

E. The Components of the Compositions Employed in the Process of This Invention 1. The Radiation-Sensitive, Intermolecularly Reactive Imageable Composition (The Color Generating System)

This component of the compositions employed comprises the imaging component and is defined in the Summary in items (1) (*a*) and (*b*). As previously stated, the preferred readout means is one in which the image is read visually. Thus in this embodiment the readout product is colored, and the intermolecularly reactive imageable composition can also be referred to (and will be so referred to hereinafter) as the color generating component or system.

The color generating system comprises two components, the first reactant [(1) (*a*) in the Summary] and the second reactant precursor [(1) (*b*) in the Summary]. The discussion of the color generating components is complicated by the fact that either component can be the actual color generator, with the other component being the radiation-sensitive actuator for the color-forming reaction. Also, as previously stated, the color-forming reaction is usually, and preferably, an oxidation-reduction type reaction initiated by photooxidation and the ensuing discussion will deal with this preferred type.

In the oxidation-reduction type, the color generator is preferably a leucodye which is converted to the dye (readout product) by loss of electrons or hydrogen atoms to the oxidant (referred to hereinafter in its preferred sense as a photooxidant.

In one embodiment, the photooxidant is activated by photoradiation and in its excited state reacts with the leucodye to produce the dye readout product. In this instance, the photooxidant is called an initiator and in the definition of the Summary is the second reactant precursor (1) (*b*), with the leucodye being the first reactant (1) (*a*). In a second embodiment, the leucodye is activated by photoradiation and in its excited state reacts with the oxidant to produce the dye readout product. In this instance, the leuco dye is the second reactant precursor (1) (*b*) and the oxidant is the first reactant (1) (*a*). In this instance, also, the oxidant is called an acceptor.

a. The Color Generator

The color generator, which can be either the first reactant (1) (*a*) or the second reactant (1) (*b*), depending upon the particular oxidant employed, is preferably a leucodye, since the leucodyes can act as either the first reactant or as the activatable second reactant precursor.

Representative leucodyes include aminotriarylmethanes, aminoxanthenes, aminothioxanthenes, amino-9,10-dihydroacridines, aminophenoxazines, aminophenothiazines, aminodihydrophenazines, aminodiphenylmethanes, leuco indamines, aminohydrocinnamic acids (cyanoethanes, leucomethines), hydrazines, leuco indigoid dyes, amino-2,3-dihydroanthraquinones, phenethylanilines, 10-acyl-aminodihydrophenazines, 10-acyl-aminophenothiazines, 10-acyl-aminophenoxazines and aminotriarylmethanes wherein the methane hydrogen has been replaced by an alkylthio, benzylthio, 2-phenylhydrazino, or alkoxycarbonyl group.

The preferred leucodyes are the aminotriarylmethanes. A general preferred aminotriarylmethane class is the salt of an acid and an aminotriarylmethane where at least two of the aryl groups are phenyl groups having (a) an $R_1R_2N$-substituent in the position para to the bond to the methane carbon atom wherein $R_1$ and $R_2$ are each groups selected from hydrogen, $C_1$ to $C_{10}$ alkyl, 2-hydroxyethyl, 2-cyanoethyl, benzyl or phenyl, and (b) a group ortho to the methane carbon atom which is selected from lower alkyl, lower alkoxy, fluorine, chlorine, bromine or butadienylene which when joined to the phenyl group forms a naphthalene ring; and the third aryl group may be the same as or different from the first two, and when different is selected from thienyl, furyl, oxazylyl, thiazolyl, indolyl, benzoxazolyl, benzothiazolyl, phenyl, naphthyl, pyridyl, quinolyl, indolinylidene, or such aforelisted groups, especially phenyl, substituted with lower alkyl, lower alkoxy, methylenedioxy, fluoro, chloro, bromo, amino, lower alkylamino, lower dialkylamino, lower alkylthio, hydroxy, carboxy, carbonamido, lower carbalkoxy, lower alkylsulfonyl, lower alkylsulfonamido, $C_6$ to $C_{10}$ arylsulfonamido nitro or benzylthio. Leucotriarylmethane dyes such as above are described in British Pat. No. 1,047,569, published Nov. 9, 1966, and British Pat. No. 1,047,796, which are incorporated herein by reference for their disclosure of specific triarylmethanes.

Representative aminoxanthenes, aminothioxanthenes, amino-9,10-dihydroacridines, aminophenoxazines, aminophenothiazines, aminodihydrophenazines, aminodiphenylmethanes, leucoindamines, aminohydrocinnamic acids, hydrazines, leuco indigoid dyes, amino-2,3-dihydroanthraquinones, and phenylethylanilines that may be used herein are disclosed in British Pat. No. 1,047,569, incorporated herein by reference for its disclosure of specific compounds of the foregoing classes.

The leucodye need not have directly removable hydrogens. Thus it may be an N-acyl dihydrophenazine, phenothiazine or phenoxazine, more fully described in U.S. Pat. application Ser. No. 363,638, filed Apr. 29, 1964, now U.S. Pat. No. 3,395,018, assigned to the assignee herein, and now under allowance, or it may be an aminotriarylmethane wherein the methane hydrogen has been replaced by an alkylthio, benzylthio, 2-phenylhydrazino, or alkoxycarbonyl group, as fully disclosed in U.S. Pat. application Ser. No. 363,639, filed Apr. 29, 1964, now U.S. Pat. No. 3,390,3997, assigned to the assignee herein, and now under allowance. Both are being incorporated herein for their disclosure of specific compounds. 2(p-Hydroxyphenyl)-4,5-diarylimidazoles that may be used as color generators and the resulting oxo-arylidine-imidazole dyes produced therefrom are disclosed in U.S. Pat. No. 3,297,710, issued Jan. 10, 1967 which is incorporated herein by reference for its disclosure of specific compounds.

N,N,N',N'-tetraalkyl-p-arylenediamines such as N,N,N',N'-tetramethyl-p-phenyline diamine and N,N,N',N'-tetrabutylbenzidine, generally employed as the hydrochlorides and oxidizable to the corresponding colored Wurster salt, may also be used herein as color generators, in combination, for example, with hexaarylbiimidazole activatable oxidants as disclosed in U.S. Pat. application, Ser. No. 682,624.

Color generators involving more than one component which produce color through a coupling reaction *in situ* may be used and include: (a) p-phenylenediamines wherein one amino group is tertiary, the other primary, as in N,N-dimethyl-p-phenylenediamine, in combination with a coupling component less easily oxidized than the diamine such as an N,N-dialkylarylamine having a free p-position, or an active methylene compound having an evolizable hydrogen, said combinations being oxidatively coupled to the corresponding colored indoanilines and azomethines; (b) iminohydrazides, oxidizable to diazonium compounds, in combination with N,N-dialkylarylamines or active methylene compounds mentioned above, which couple with the *in situ* generated diazonium intermediates to form azodyes, as disclosed by Hunig and Fritsch, Ann 609, 143 (1957).
Such complex color generators may be advantageously used with activatable hexaarylbiimidazoles as disclosed in British Pat. No. 1,057,785.

Amino substituted dye precursors, particularly the triarylmethane class, are generally employed in the color forming process as salts of acids sufficiently strong to form a salt with the aromatic amino-, i.e. anilino type, nitrogen. Included are mineral acids, such as hydrochloric, hydrobromic, sulfuric, nitric, and phosphoric; organic acids such as acetic, oxalic, p-toluenesulfonic, trichloroacetic, trifluoroacetic, perfluoroheptanoic and the like acids; Lewis acids such as zinc bromide, and ferric chloride; the proportion of acid varying from 0.33 mole to 1 mole per amino group.

The portions of the patents and applications cited in the immediately foregoing four paragraphs which are pertinent to the leucodye disclosures recited are hereby incorporated by reference.

The oxidizable color generator should of course not be an inhibitor of the particular polymerization reaction chosen for deactivating the color-forming system. This is readily determined by trial.

b. The Oxidant

The oxidants which oxidize the leucodye color generator to produce the colored dye readout product may, as discussed above, be an initiator or an acceptor, which, as also discussed above, determines whether the oxidant is the first reactant (1) (*a*) or the second reactant precursor (1) (*b*). Some photooxidants can function as either initiators or acceptors, depending on the wavelength of the activating light.

Normally, and preferably, the oxidant is an initiator; hence, will be the second reactant precursor. Oxidants functioning as initiators will be discussed first.

The preferred initiator oxidant is a hexaarylbiimidazole (sometimes referred to as a triarylimidazolyl dimer). They are activatable by light, heat or electron beams and will activate any of the leucodye color generators described above. They can also serve to act as the polymerization initiator (3) and their function in this capacity will be discussed more fully below under the section headed "The Polymerization Initiator." Because of their dual function, the hexaarylbiimidazoles constitute a preferred component of the compositions employed in the process of this invention.

The hexaarylbiimidazoles are the 2,2',4,4',5,5'-hexaarylbiimidazoles that absorb ultraviolet light principally at wavelengths in the range of 235–375 $\mu$, and are thereby dissociated into the corresponding 2,4,5-triarylbiimidazolyl radicals. They can be represented by the formula

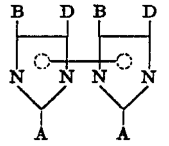

wherein A, B and D represent aryl groups which can be the same or different, carbocyclic or heterocyclic, unsubstituted or substituted with substituents that do not interfere with the dissociation of the biimidazole to the imidazolyl radical or with the oxidation of the leucodye, and each dotted circle stands for four delocalized electrons (i.e., two conjugated double bonds) which satisfy the valences of the carbon and nitrogen atoms of the imidazolyl ring.

The aryl groups include one and two-ring aryls, such as phenyl, biphenyl, naphthyl, furyl and thienyl. Suitable inert substituents on the aryl groups have Hammett sigma (para) values in the −0.5 to 0.8 and range are other than hydroxyl, sulfhydryl, amino, alkylamino or dialkylamino. Preferably they are free of Zerewitinoff hydrogen, i.e., have no hydrogens reactive towards methyl magnesium iodide. Representative substituents and their sigma values, (relative to H=.00), as given by Jaffe, Chem.Rev.*53*, 219–233(1953) are: methyl (−0.17), ethyl (−0.15), t-butyl (−0.20), phenyl (0.01), trifluoromethyl (0.55), chloromethyl (0.18), cyanomethyl (0.01), 2-carboxyethyl (−0.07), butoxy (−0.32), phenoxy (−0.03), fluoro (0.06), chloro (0.23), bromo (0.23), iodo (0.28), methylthio (−0.05 ), methylsulfonyl (0.73), nitro (0.78), ethoxycarbonly (0.52), cyano (0.63), and carboxyl (0.27). Thus, the substituents may be halogen, cyano, lower hydrocarbyl (including alkyl, halo alkyl, hydroxyalkyl, cyanoalkyl, and aryl), alkoxyl, aryloxy, alkylthio, arylthio, sulfo, alkyl sulfonyl, aryl-sulfonyl, and nitro. In the foregoing list, alkylgroups referred to therein are preferably of one-sixth carbon atoms; while aryl groups referred to therein are preferably of sixth-tenths carbon atoms.

Normally the B and D groups can carry 0–3 substituents and the H ring 0–4 substituents.

Preferably the aryl radicals are carbocyclic, particularly phenyl, and the substituents have Hammett sigma values in the range −0.4 to +0.4, particularly lower alkyl, lower alkoxy, C1, F and Br groups.

In a preferred biimidazole class, the 2 and 2' aryl groups are phenyl rings bearing an orthosubstituent having a Hammett sigma value in the range −0.4 to =4. Preferred such ortho substituents are fluorine, chlorine, bromine, lower alkyl and alkoxy groups; especially chloro.

Most preferably, the 2-phenyl ring carries only the above-described orthogroup, and the 4- and 5-phenyl rings are either unsubstituted or substituted with lower alkoxy.

Specific examples of the foregoing hexaarylbiimidazoles are disclosed in British Pat. No. 1,047,569; British Pat. No. 997,396. The portions of said patents pertinent to the biimidazole disclosure recited are incorporated herein by reference.

As stated above, the hexaarylbiimidazoles can be activated by heat, light, electron beams, or X-rays Other classes of oxidants which can be employed in the compositions used in this invention and which are thermally activatable for reaction with the leucodyes to produce the readout product include diacyl peroxides, e.g. benzoyl peroxide, acetyl peroxide, p-chlorobenzoyl peroxide, succinyl peroxide, and naphthoyl peroxide; cyclohexanone peroxide;

dialkyl peroxides, e.g. tert-butyl peroxide, cumyl peroxide, and tert-amyl peroxide; acyl alkyl peroxides, e.g. tert-butyl perbenzoate;

hydroperoxides, e.g. cumene hydroperoxide, tert-amyl hydroperoxide, tert-butyl hydroperoxide and pinane hydroperoxide; azocompounds, e.g., 2,2'-azobis(2-methylpropionitrile), azodicyclohexylcarbonitrile, dimethyl 2,2'-azobis (2-methylpropionate), phenylazodiphenylmethane and azobis (diphenylmethane);

N-chlorosubstituted compounds, e.g., N-chloro-N-ethyl-m-nitrobenzenesulfonamide, N,N',4,4'-tetrachlorooxanilide, N,N'-dichloro-N,N'-dimethylbiphenylenesulfone-4,4'-disulfonamide, and N,N'-dichloro-N,N'-bis(m-nitrobenzenesulfonyl)ethylenediamine;

said classes being disclosed in heat-activated imaging compositions with various color generators requiring imaging temperatures between 90° and 150° C. in Canadian Pat. No. 775,504, issued Jan. 9, 1968. The portions pertinent to the foregoing are incorporated herein by reference.

Photooxidants which generally function as acceptors and thus act as the first reactant (1)(*a*) that may be used in image-producing combinations with leucodyes and other color generators [which act as the second reactant precursor (1)(*b*) ] in the method of this invention include:

a. 1,1'-and 1,2'-bibenzotriazoles, binaphthotriazoles and benzotriazolylnaphthotriazoles such as those disclosed in U.S. Pat. Nos. 3,207,763 and 3,184,771 and, in combination with leucodyes, in U.S. Pat. No. 3,360,370 and in U.S. Pat. application Ser. Nos. 363,638, filed Apr. 29, 1964, now U.S. Pat. No. 3,395,018, and 681,118, filed Nov. 7, 1967, assigned to the assignee herein, the pertinent portions of which are incorporated herein by reference;

b. acylazino compounds such as tetraacylhydrazines, diacylhydrazines, diacylaminopyrroles, diacylaminopyrazoles, diacylaminocarbazoles, diacylaminobenzimidazoles, diacylaminobenztriazoles, diacylaminotriazoles, and diacylaminohydrotriazines, as disclosed and exemplified with leucodyes in photosensitive imaging combinations in U.S. Pat. No. 3,364,030 and in U.S. Pat. applications Ser. Nos. 681,118, filed Nov. 7, 1967, 363,638 and 363,639, now U.S. Pat. No. 3,390,997, both filed Apr. 29, 1964, all assigned to the assignee herein, the pertinent portions of which are incorporated herein by reference;

c. triacylhydroxylamines such as N,N,0-triacetylhydroxylamine, N,N,0-tribenzoylhydroxylamine and others as disclosed and exemplified with leucos in imaging compositions in U.S. Pat. No. 3,359,109 and in U.S. Pat. applications Ser. Nos. 681,116, filed Nov. 7, 1967, 363,638 and 363,639, both filed Apr. 29, 1964, now U.S. Pat. No. 3,395,018 and 3,390,997 respectively, all assigned to the assignee herein, the pertinent portions of which are incorporated herein by reference.

With the immediately foregoing classes of acceptor oxidants, the leucodyes absorb the radiation and react in their excited state with the acceptor oxidant to form the readout product.

2. The Polymerizable Monomer

This component of the compositions employed in the process of the invention is denoted as (2) in the Summary and comprises at least one terminally ethylenically unsaturated addition polymerizable organic monomer that a. is nongaseous, preferably liquid and preferably boils above 100° C. at atmospheric pressure b. exerts a plasticizing effect on the components of the imaging system and the polymeric binder when present in the image-fix composition and preferably is a solvent for the imaging components c. is normally subject to addition polymerization initiation d. polymerizes to a hard, substantially rigid polymer which transforms the image-fix composition to a hard, rigid substantially immobilized composition.

By the term "monomer" is meant addition polymerizable compounds in the generic sense. Thus it includes both low- and high-molecular-weight compounds, including polymeric compounds, which have at least one polymerizable ethylenic group, preferably a terminal $CH_2$ C > group, free to polymerize. Thus this component may be a relatively simple monomer or it may be a polymer having cross-linkable ethylenic groups. Preferably its molecular weight is below about 1500 and it contains two or more ethylenic, particularly vinylic groups, for crosslinking and thus more rapid and complete rigidification of the matrix. More preferred monomers are the terminally unsaturated carboxylic ester monomers.

Suitable monomers include alkylene and polyalkylene glycol diacrylates prepared from alkylene glycols of two to 15 carbons and polyalkylene ether glycols of one to 10 ether linkages; also those disclosed in Martin and Barney U.S. Pat. 2,927,022 having a plurality of addition polymerizable ethylenic linkages, particularly terminal linkages, and especially having at least one and preferably most of such linkages conjugated with doubly bonded carbon, including carbon doubly bonded to carbon and to such heteroatoms as nitrogen, oxygen and sulfur. Outstanding are such materials as the vinylidene groups, conjugated with ester or amide groups. The following specific classes and compounds further illustrate this class: alpha-methylene carboxylic acid esters of polyols, e.g., ethylene glycol diacrylate, diethylene glycol diacrylate, triethylene glycol diacrylate, glycerol diacrylate, glycerol triacrylate, ethylene glycol dimethacrylate, 1,2-propanediol dimethacrylate, 1,2,4-butanetriol trimethacrylate, 1,4-cyclohexanediol diacrylate, 1,4-benzenediol dimethacrylate, pentaerythritol tetramethacrylate, 1, 3-propanediol diacrylate, 1,5-pentanediol dimethacrylate, pentaerythritol triacrylate; the bisacrylates and methacrylates of polyethylene glycols of molecular weight 200–500, and the like; alpha-methylene carboxylic acid amides, particularly of alpha-omega-diamines and oxygen-interrupted omega-diamines, such as methylene bis-acrylamide, methylene bismethacrylamide, ethylene bis-methacrylamide, 1,6-hexamethylene bis-acrylamide, diethylene triamine trismethacrylamide, bis (gamma-methacrylamidopropoxy)ethane beta-methacrylamidoethyl, methacrylate, N-(betahydroxyethyl)-beta-(methacrylamido) ethyl acrylate and N,N-bis (beta-methacryloxyethyl)acrylamide; vinyl esters such as divinyl succinate, divinyl adipate, divinyl phthalate, divinyl terephthalate; divinyl benzene-1,4-disulfonate, and divinyl butane-1,4-disulfonate.

There may also be used the polymerizable ethylenically unsaturated polymers of Burg U.S. Pat. 3,043,805 and Martin U.S. Pat. No. 2,929,710 e.g., polyvinyl acetate/acrylate, cellulose acetate/acrylate, cellulose acetate/methacrylate, and N-acrylyloxymethyl polyamide. These materials can serve both as monomer and binder as the ethylenic groups are present as extra linear substituents attached to polymer chains. Other cross-linkable polymers may be used, preferably as a binder and cross-linking agent, e.g., polyoxyethylated trimethylol propane triacrylate, polytetramethylene glycol diacrylate, etc. disclosed in Schoenthaler U.S. Pat. application Ser. No. 451,300 filed Apr. 27, 1965, now U.S. Pat. No. 3,418,295, assigned to the assignee herein; also polymerizable and cross-linkable alkyds such as the maleates and fumarates of ethylene glycol, propylene glycol, polyethylene glycols and polypropylene glycols. These cross-linking agents serve also to increase the viscosity of the starting image-fix composition to the desired nonflowable (but nonrigid) range as discussed more fully below.

Many polymerizable monomers of the above classes are available commercially and as such may contain small amounts of polymerization inhibitors, e.g., hydroquinone, pyrogallol, tert.butylcatechol, p-methoxyphenol, betanaphthol, 2,6-ditert.butyl-p-crescol, naphthylamine, phenothiazine and the like. While it may sometimes be desirable in the present invention that the monomers contain an inhibitor, for example, to guard against premature, usually thermally initiated, polymerization or to provide a slight induction period during imaging as indicated earlier, it is usually preferred to employ inhibitor-free material, obtained either by removing the inhibitor when present, as by absorption on activated alumina, or by direct synthesis.

One suitable method for preparing monomers of the preferred unsaturated carboxylic ester type in high yields substantially without polymerization loss, comprises esterifying an ethylenically unsaturated acid chloride such as acrylyl or methacrylyl chloride with a polyol such as glycerol, triethyleneglycol, pentaerythritol, or the like hydroxylated compound, in the presence of an N,N-dialkylarylamine such as N,N-dimethylaniline or N,N-diethylaniline in stoichiometric HC1-binding amounts. This method is operable in the absence of polymerization inhibitor; unsaturated esters so-prepared are particularly useful in actinic-radiation-initiated polymerizations, polymerizing readily and rapidly to rigid polymers, while having high resistance to premature-polymerization in storage.

3. The Polymerization Initiator

The addition-polymerizable monomers may be polymerized to hard rigid products by directly irradiating with sufficiently energetic radiation, e.g., ultraviolet light or electron beams. It is preferred, however, to incorporate therewith a radiation-activatable, preferably photoactivatable, polymerization initiator. This affords greater latitude in selecting and controlling the fixing conditions. A vast variety of addition-polymerization initiators are known and may be used herein, which on suitable exposure to radiation generate polymerization initiating species, generally regarded as free radicals, that is, anions, cations or neutral fragments containing an odd election and capable of adding to ethylenic groups to produce new free radicals also capable of adding to ethylenic groups and thus propagating the polymerization.

The initiator is chosen of course with due regard to the other components, particularly the color-forming system and the radiation means and conditions to be employed for imaging as well as for fixing. Thus the initiator should be compatible with the composition's other components, should not interfere with the readout producing-reaction, and should be activatable under irradiation conditions that are practically ineffective to produce the r adout product. When fixing with light, heat or an electron beam, the initiator should of course be light-, heat- or electron beam-activatable as the case may be. The initiator may be the same as or different from the oxidant employed for imaging, the choice depending on whether the image-fix steps are to involve radiation intensity control of the activated initiator concentration, wavelength control of the activated initiator concentration, different and independent imaging and fixing radiations, or the same but independent radiations. These types of radiation in conjunction with the image-fix steps of the invention were discussed more fully above in the section entitled "C. Embodiments of the Invention."

The hexaarylbiimidazoles described above as preferred oxidants for color generators, are also the preferred polymerization initiators, particularly when they are in combination with electron-donating free radical generators, as more fully disclosed in Belgian Pat. No. 681,944. Amines, particularly tertiary amines, are preferred electron donors or coinitiators, including aminosubstituted leucodyes useful herein as color generators. In other words, the biimidazole/aminotriphenylmethane leucodye combination is effective both to produce readout product (dye) in the imaging step and to initiate rigidifying polymerization in the fixing step.

It is usually advantageous to employ along with the biimidazole/aminotriphenylmethane leucodye photopolymerization initiator combination another free radical generator or chain transfer agent, usually in amounts ranging from .01 to 0.1 mole/leucodye. Such chain transfer agents as N-phenylglycine, 1,1-dimethyl-3,5-diketocyclohexane, 2-mercaptobenzothiazole, 2-mercaptobenzoxazole, 2-mercaptobenzimidazole, pentaerythritol tetrakis(mercaptoacetate), 4-acetamidothiophenol, mercaptosuccinic acid, dodecanethiol and beta-mercaptoethanol greatly speed up the polymerization reaction during the deactivation step and only slightly decrease color formation during the color-forming step.

How the biimidazoles may be utilized for imaging and fixing in the various embodiments, can be better understood by referring to their spectral characteristics. As a class they absorb maximally in the 235–285 $\mu$ region, and usually show substantial absorption in the 300–375 $\mu$ region. Almost all continue to absorb, through weakly, at 400 $\mu$ and beyond, tailing out to about 420 $\mu$. Accordingly, to activate the greatest proportion of the biimidazole molecules at any one instant for dissociation into radicals and consequent leucodye oxidation in the imaging step, one may irradiate into the regions of maximum absorption, which correspond to the maximum population of excited states. The more intense the radiation, the greater the mol fraction that is activated and the higher the color density produced. With decreasing intensity, a point is reached where, judging from the resulting low color density, only a minute fraction of the biimidazole molecules is activated.

Likewise, irradiating only into the tail portion of the biimidazole absorption region, e.g., in the 400–420 $\mu$ region, which corresponds to a small fraction of the total absorption, hence to a small excited state population, activates only a fraction of the biimidazole molecules, normally too small for satisfactory imaging. For reasons discussed above, in the section entitled "D. Theory of the Invention," such small, substantially nonimaging fractions, whether produced by irradiating with light of weak intensity corresponding to major absorption regions or with light no matter how intense corresponding to minor absorption regions, can effectively initiate addition-polymerizations for the purpose of this invention.

Since the photopolymerization-initiating biimidazole/leuco dye combinations can also be activated by heat or electron beam radiation, their use both in imaging activation and polymerization initiation with the heat or electron beam radiation is analogous to the foregoing description concerning photoactivation. That is, their use will depend upon the thermal or electron beam intensity of flux (the rate of flow of the activating energy into the composition) and the total dosage employed. Thus, for example, in heat-activated embodiments the biimidazoles will generally be selected on the basis of the temperature at which they form the imidazolyl radicals, which normally is in the 60 to 180° C. range. In general, most suitable for use at the lower end of the temperature range are biimidazoles that bear unsubstituted phenyls at the 2- and 2′-positions and preferably bear ortho-, meta- or para-substituted phenyls at the 4,5- and 4′5′-positions, lower alkyl, lower alkoxyl and chloro substituents being preferred. Examples are 2,2′,4,4′,-5,5′-hexaphenyl biimidazole, 2,2′-diphenyl-4,4′,5,5′-tetrakis(*o*-tolyl)biimidazole, 2,2′-diphenyl-4,4′,5,5′-tetrakis(*o*-methoxyphenyl)biimidazole, 2,2′-diphenyl-4,4′,5,5′-tetrakis (*p*-methoxyphenyl)biimidazole, 2,2′-diphenyl,4,4′,5,5′-tetrakis (*p*-chlorophenyl)biimidazole. Preferred for use at the upper end of the heat range are biimidazoles that bear at the 2 and 2′-positions phenyls that have at least one ortho substituent as defined above and preferably bear meta- lower alkyl- or lower alkoxyl- substituted phenyls at the 4,4′ and 5,5′-positions. Examples are 2,2′-bis(*o*-chlorophenyl)-4,4′,5,5′-tetraphenyl biimidazole, 2,2′-bis(*o*-chlorophenyl)-4,4′,5,5′-tetrakis (*m*-methoxyphenyl)biimidazole, and 2,2′-bis(2,6-dichlorophenyl)-4,4′,5,5′-tetrakis (*m*-methoxyphenyl)biimidazole. Others that are heat-activatable and useful herein include 2,2′-bis(*p*- methoxyphenyl)-4,4',5,5'-tetraphenylbiimidazole, 2,2'-bis(*p*-benzylthiophenyl)-4,4',5,5'-tetraphenylbiimidazole, 2,2'-bis(3,4-dimethoxyphenyl)-4,4',5,'-tetraphenylbiimidazole, and 2,2',4,4',5,5'-hexakis (*p*-methoxyphenyl)biimidazole.

Other substances useful both as oxidants for imaging and as polymerization initiators for fixing include the tetraarylhydrazines, acylperoxides, alkyl peroxides, hydroperoxides, azocompounds and N-halo compounds disclosed above in the section entitled "b. Oxidants." Such substances generally dissociate to active radicals between 60° and 180° C., the higher the temperature and the greater the heat flux, the greater the proportion that dissociates.

Polymerization initiators which are not also oxidants for the color generator may be used to initiate the fixing step. These initiators should be activatable under radiation conditions ineffective to produce the readout product, in particular under conditions ineffective to activate the imaging reaction oxidant, and should of course not interfere with the imaging components under imaging conditions. Preferably these initiators are photoactivatable at relatively long, e.g. visible region, wavelengths for use in conjunction with oxidants for the imaging reaction that are not photoactivatable at said longer wavelengths. Since the polymerization system is here essentially independent of the imaging system, preferred polymerization initiators have high extinction coefficients in the fixing range to provide high initiator concentrations for rapid fixing.

Visible light-activatable initiators of this type useful herein, particularly with ultraviolet light-activatable imaging oxidants, include polynuclear quinones and photoreducible dyes. Suitable quinones are disclosed in U.S. Pat. Nos. 2,951,758, 3,198,633, and 3,046,127. Examples include 9,10-anthraquinone and its 1-chloro, 2-chloro-, 2-methyl, 2-ethyl, 2-tert.butyl-, 1,4-dimethyl-, 2,3-dimethyl-, 2-phenyl-, 2,3-diphenyl and octamethyl derivatives; 1,4-naphthoquinone, 2-methyl-1,4-naphthoquinone; 9,10-phenanthrenequinone; 1,2-benzanthraquinone, 1,6and 1,8-pyrenequinone, 1-methoxyanthraquinone, 1-chloroanthraquinone-2-aldehyde, 1-chloro-2-carbomethoxyanthraquinone, 1-aminoanthraquinone, 1-cyanoanthraquinone, 4-methoxy-1,2-naphthoquinone, 2-methoxy-1,4-naphthoquinone, fluoranthrenequinone, 2-methoxyphenanthrenequinone, 2-bromophenanthrenequinone, 3-bromophenanthrenequinone, 2-nitrophenanthraquinone, 2-acetoxy and 3-acetoxphenanthraquinone, 2,6-naphthoquinone, phenazine, methoxyphenanthrazine, 4-methyl-4-trichloromethyl cyclohexadieneone. Photoreducible (photobleachable) dyes useful herein as initiators are disclosed in U.S. Pat. Nos. 2,850,445, 2,875,047 and 3,097,096. Included are hydroxyphthalein, acridine and related dyes such as fluorescein, 4,5-dibromofluorescein, eosin, erythrosin, rose bengal, methylene blue and diethyl orange.

It is generally accepted that these substances function as polymerization initiators by being activated to an excited state which generates free radicals by abstracting an electron or hydrogen atom from a neighboring molecule. Thus the initiators are preferably employed in conjunction with an added electron or hydrogen atom source—sometimes referred to as a reductant or chain transfer agent. Suitable agents (which should be substantially inert to the imaging oxidant so as not to compete with the color generator for such oxidant during the imaging step) are disclosed in U.S. Pat. No. 3,046,127 for use with the quinone initiators and include aliphatic primary and secondary alcohols, polyols including alkylene glycols, and polyethers including polyalkylenetherglycols. Others useful herein are disclosed in British Pat. No. 1,057,785 as reductants for photoactivated quinones, and include ethers, esters, aminoalkanols, compounds containing allylic or benzylic hydrogen, acetals, aldehydes, and amides, as described in said British patent. Still others are the nitrilotriacetates and tripropionates, $N[(CH_2)_nCOOR]_3$, where *n* is the integer 1 or 2 and R is a lower alkyl group, disclosed as reductants for pyprenequinone and phenanthrene quinone in U.S. Pat. application Ser. No. 534,591, filed Feb. 17, 1966, now U.S. Pat. No. 3,390,994, and assigned to the assignee herein, and now under allowance. Reducing agents for the photoreducible dyes include allylthiourea, trimethyl nitrilotripropionate, polyethylene glycols, and substituted benzenesulfonamides and anilides such as N-methyl-N-phenylbenzene-sulfonamide, N-methyl-N-phenyl-toluenesulfonamide, N-[m-nitrophenyl]-p-toluenesulfonamide, N-methyl-N-phenyl-p-nitrobenzene-sulfonamide, and N-[m-nitrophenyl]-p-nitrobenzene-sulfonamide.

The photoreduction products of the immediately aforementioned quinones and chain transfer agents are disclosed in the above U.S. applications as imaging system deactivators. It has now been found, however, that when polymerizable monomer is present, rigidification fixing predominates over reductive fixing. This affords important advantages: fixing is more rapid, for improved utility in making positive working images, for example; fixing is more complete as the image-fix composition is stabilized towards ambient indoor and outdoor light; the fixed areas are rendered nontacky and nontransferably, for permanent imaging under noncontact sequential irradiation conditions; and polymerization fixing requires smaller quantities of the initiator than reductive fixing, minimizing the background color usually associated with the use of polynuclear quinones, for example.

4. Plasticizers, Binders, Fillers and Sensitizers

The radiation-sensitive material employed in the process of this invention may also include one or more of the recited classes of additional components.

Although the polymerizable monomer serves to plasticize the normally solid imaging components in the initially formulated image-fix compositions described above, it is sometimes advantageous to include one or more compatible volatile carrier solvents, other plasticizers, binders or fillers to provide for intimate contact among the various imaging and fixing components, to facilitate their application to substrates, to improve their adhesion to substrates, and to provide other desirable characteristics. For example with the solvent evaporated (when coated on a support or when confined between the support surface and an image-bearing transparency or a transparent cover) the image-fix composition should be nonflowable but not so viscous as to prevent reasonably fast diffusion of the imaging components therein during the imaging step.

Suitable inert solvents for casting image-fix compositions include amides such as N,N-dimethyl formamide, N,N-dimethylacetamide; alcohols such as methanol, ethanol, 1-propanol, 2-propanol, butanol, ethylene glycol; ketones such as acetone, methyl ethyl ketone, 3-pentanone; halocarbons such as methylene chloride, chloroform, 1,1,2-trichloroethane, and 1,1,2,2-tetrachloroethane; polyethylene glycols; esters, e.g., ethyl acetate and ethyl benzoate; aryls such as benzene, o-dichlorobenzene and toluene; dimethylsulfoxide, pyridine, acetonitrile, tetrahydrofuran, dioxane, 1,1,2-trichloroethylene, 1-methyl-2-oxohexamethyleneimine, and mixtures thereof.

Suitable plasticizers include the polyethylene glycols, such as the commercially available Carbowaxes, and related materials, such as substituted phenol-ethylene oxide adducts for example the products obtained from p-phenylphenol and 6 moles ethylene oxide, and from p-nonylphenol and 2 moles ethylene oxide, including commercially available materials such as the Igepal alkyl phenoxy polyoxethylene ethanols: ($C_1$–$C_4$ alkyl) nitrilo triacetates and tripropionates such as methyl nitrilotriacetate.

Light-transparent and film-forming polymers are useful as binders, and carriers for the essential ingredients described above. Representative of the above are polyvinyl alcohol, polyvinyl acetals (e.g., polyvinyl formal and butyral, cellulose ethers and esters (e.g., ethyl cellulose, cellulose acetate, cellulose butyrate, cellulose acetate butyrate), polyvinyl esters, e.g., polyvinyl acetate, polyvinyl acetate/acrylate, polyvinyl acetate/methacrylate, polyvinyl and polyvinylidene halides and copolymers (e.g., polyvinylchloride, polyvinylidene chloride, polyvinylchloride/acetate), polyalkyl acrylates and methacrylates (e.g., polymethyl methacrylate, polyethyl acrylate, polybutyl methacrylate), polystyrene, gelatin, polyvinyl pyrrolidone, copolymers of vinyl pyrrolidone and vinyl acetate, polyacrylonitrile, polymethacrylonitrile and copolymers thereof, and polyethylene. Suitable fillers include titanium dioxide, organophilic colloidal silicas, bentonites and powdered glasses.

It will be noted that many of the plasticizers and binders classes can also serve as chain transfer agents for use with photopolymerization initiators such as the hexaarylbiimidazoles, polynuclear quinones and photoreducible dyes described above and are preferably employed therewith.

The image-fix compositions may also contain sensitizers that extend the spectral sensitivity of the imaging and/or fixing systems to longer wavelengths. Sensitizers useful with the preferred biimidazole/leucodye combinations include (a) hydroxyphthalein dyes such as fluorescein, the eosins, the phloxines, the erythrosins, rose bengal, and others disclosed in U.S. Pat. application Ser. No. 654,720, filed July 20, 1967, now U.S. Pat. No. 3,563,750, and assigned to the assignee herein, (b) acridine dyes, particularly 3,6-bis(alkylamino)acridines such as 3,6-bis(dimethylamino)acridine hydrochloride, 3,6-bis(diethylamino)acridine hydrochloride, 2,7-dimethyl-3,6-bis(ethylamino)acridine hydrochloride, 2,7-dimethyl-3,6-bis(diethylamino)acridine hydrochloride, 3,6-bis(dimethylamino)-10-methyl acridinium methanesulfonate and others disclosed in U.S. Pat. application Ser. No. 654,721, filed July 20, 1967, now U.S. Pat. No. 3,563,751, and assigned to the assignee herein, (c) carbocyanine dyes such as 3,3′-diethyl oxacarbocyanine iodide, 3,3′-diethyl-9-methyl oxacarbocyanine iodide, 3,3′,9-trimethyl oxacarbocyanine iodide, 3,3′-diethyl-4,5,4′,5′-dibenzoxacarbocyanine p-toluene sulfonate, 3,3′ -diethyl oxaselenacarbocyanine iodide, 3,3′-di-n-butyl-9-methylthiacarbocyanine iodide, 3,3′-diethyl iodide, and 3,3′-diethyl selenacarbocyanine iodide, and others disclosed in U.S. Pat. application Ser. No. 654,676, filed July 20, 1967, now U.S. Pat. No. 3,554,753, and assigned to the assignee herein, (d) coumarins such as 7-dimethylamino-4-methylcoumarin, 7-dimethylamino-4-butylcoumarin, 7-diethylamino-4-ethylcoumarin, and others disclosed in U.S. Pat. application Ser. No. 622,526, filed Mar. 13, 1967, now U.S. Pat. No. 3,533,797, assigned to the assignee herein, and (e) aminophenylketones such as p-dimethylaminobenzophenone, p,p-bis(dimethylamino)-benzophenone, p,p′-bis(diethylamino)benzophenone and others disclosed in U.S. Pat. application Ser. No. 654,677, filed July 20, 1967, now U.S. Pat. No. 3,552,973, and assigned to the assignee herein. For sensitized imaging, sensitizers of classes a, b and c above are generally used in amounts ranging from about 0.01 to 0.1 mole, preferably 0.01–0.05 mole, per mole of the biimidazole; those of classes d and e above in amounts ranging from about 0.1 to 2 moles, preferably 0.4 to 0.6 mole, per mole of the biimidazole. The pertinent portions of the aforementioned applications are incorporated herein by reference.

It will be noted that some of the photoreducible dyes disclosed above can sensitize both (a) the hexaarylbiimidazole/-leucodye imaging component to visible light as disclosed further below and (b) the hexaarylbiimidazole/leucodye/polymerizable monomer systems to visible light as disclosed in Belgian Pat. No. 681,944. The polymerization reaction can be made to predominate over the dye-sensitized imaging reaction because the polymerization initiation and the imaging activation functions involve mutually exclusive, though competitive reactions. In polymerization initiation, the activated dye makes its absorbed energy available to the polymerization system through free radical-producing reaction with an electron or hydrogen atom source described previously. For sensitization for the imaging reaction, however, the activated dye must transfer its absorbed energy to the imaging system, e.g., to the oxidant, before it reacts with the color generator. The thus-indirectly activated oxidant then reacts intermolecularly to produce the readout product. Whereas sensitized imaging requires that at least one activated dye molecule take part in the energy transfer sensitization step for every readout product molecule subsequently produced, polymerization requires substantially fewer active initiator molecules, for reasons discussed earlier. Another though relatively minor contributing factor is that the activated dye tends to be reduced, i.e., photobleached in the competing polymerization initiation process and thus inactivated for sensitization for imaging activation.

Thus, when an imaging sensitizer is present that is also a polymerization initiator, one aspect of the image-fix method of this invention involves imagewise and sequentially irradiating with UV light (into the photooxidant directly) to image and irradiating with visible light (into the dye only) to fix, while modulating the visible light intensity so as to minimize or prevent concurrent sensitized imaging (i.e., nonsensitized imaging coupled with dye-initiated fixing). Another aspect involves irradiating with high intensity visible light to image and with low intensity visible light to fix (i.e., dye-sensitized imaging coupled with dye-initiated fixing).

5. Component Proportions and Ratios

Since the amount of the readout product generator determines the readout density, the amounts of the other components will usually be based on it. The readout product generator amount depends on the readout property intensity, the sensitivity of the sensing means and the effect desired. To obtain readout product sufficient to correspond to optical densities of at least 0.3 above background, as determined with a Macbeth Quantalog densitomer, the amount of the preferred triarylmethane leucodye present is normally from 1 to 10% by weight, based on the total weight of the composition.

To efficiently utilized the readout product generator, the imaging system's other major component should be employed in stoichiometrically comparable amounts. For example, one hexaarylbiimidazole molecule is stoichiometrically required for each leucodye molecule; however, from 1 to 2 moles/mole of leucodye is usually employed. More or less may be used, although more is generally unnecessary while less tends to waste the leucodye color generator.

The amount of the polymerizable monomer present depends on its plasticizing effect on the other ingredients of the composition, its polymerization characteristics, its cross-linkability and the rigidity of its polymerizate. Typically, amounts range from 10 to 100 moles/mole of readout product generator, leucodye, more usually from 15 to 25 moles/mole. With the more limited monomer proportions there is generally also provided a plasticizer, usually at least 25% by weight based on the weight of the monomer or 10 to 50% by weight of the total composition. The amount of the polymerization initiator, when it is different from the leucodye activator, will wary depending on the initiator, but normally will range from 0.0001 to 1 mole/100 moles of the monomer. The chain transfer agent when employed corresponds to at least 0.1 to 10 moles/mole of the initiators, but may be in great excess, e.g., 50–100 moles/mole, especially when it also serves as binder or plasticizer.

F. The Imaging and Fixing Steps

As stated in the Summary, the process of this invention comprises providing an image-fix composition as described previously in suitable physical form such as a self-supporting film, or an impregnate in or a coating on a suitable support, then sequentially irradiating with imaging radiation and fixing radiation, applied in any order but with the first applied imagewise as through a stencil or a projected image. Imaging first, fixing second yields a negative image, fixing first, imaging second a positive image.

As also stated previously, the imaging and fixing radiations may be the same or different and each may differ as to type, intensity or wavelength, the conditions being matched to the image-fix compositions and depending primarily on how the compositions selected for the imaging and fixing reactions respond to the various possible activating radiations. For example the response of light- or heat-activated oxidants may vary considerably from class to class and from compound to compound within each class. Optimum conditions for any particular formulation are easily determined by trial in accord with the principles discussed herein.

With compositions comprising hexaarylbiimidazole, leucodye and monomer exposures for the imaging step with actinic radiation wary with the composition (i.e., with the imaging reaction rate and the polymerization rate) and with the intensity, the higher the intensity, the shorter the exposure time. In general, the intensity should be greater than 1 milliwatt per square centimeter of exposed area (equivalent to 1 millijoule/sec.-cm.$_2$), preferably greater then 5 mw./cm.$^2$, with intensities on the order of $10^6$ mw./cm.$^2$ successfully employed. Exposure times may vary from a fraction of a second to many minutes, e.g. $10^{13}$ to $10^3$ seconds, with longer times generally unnecessary. The total imaging exposure is normally between 5 and 1000 mj./cm.$^3$, more usually between 25 and 100 mj./cm.$^2$.

The fixing exposure with compositions comprising hexaarylbiimidazole, leucodye and monomer may vary greatly. The intensity may be above or below the threshold intensity for imaging so long as the total exposure is adequate to effect the polymerization fix without imaging. For slow fix systems, the intensity is generally below the threshold for imaging ,i.e., 1 mw/cm$^2$ or less with exposure time not critical. For fast fix systems the intensity may exceed the threshold for imaging, but the total exposure will of course be less than for imaging. Exposures for fixing at all intensities are usually less than 10 mj./cm.$^2$, often between about 1 and 5 mj./cm.$^2$.

When image-fix compositions such as the foregoing contain additionally a polymerization initiator activatable at longer wavelength than the biimidazole the fixing intensity is not critical; normally the imaging radiation is rich in wavelengths between 250 and 370 $\mu$, the fixing radiation rich in wavelengths corresponding to the maximum absorption region of the second initiator (e.g., 380–500 $\mu$ for the polynuclear quinones, 500–650 $\mu$ for the photoreducible dyes) with substantially no wavelengths overlapping the biimidazoles absorption bands (suitable light bands being obtained with cutoff band pass filters if needed).

Suitable light sources with varied intensities and spectral characteristics are available and include continuous or pulsed xenon lamps, germicidal lamps, BlackLite and other ultraviolet (UV), near UV and visible emitting phosphored fluorescent lamps, mercury lamps, metal additive lamps, carbon arc lamps, tungsten lamps such as photoflood and quartz-halide lamps and other filament arc lamps, fluorescent lamps, lasers (e.g., a pulsed nitrogen laser emitting at 337 $\mu$), cathode ray tubes with fiber optics and near UV or visible light-emitting phosphors, and natural light, either outdoor or indoor. Intensity control of the color-forming and deactivating radiations can be achieved by such well-known expedients as varying the light source and its wattage, the distance from the target and the degree of scatter.

Similarly, the conditions for heat-activated imaging and fixing depend on the materials employed. In general, temperatures are in the 60° to 180° C. range with exposure times ranging from several seconds to many minutes. In general the color developed from a heat activated oxidant and a leucodye is linear with time at a given temperature, there being a family of such curves, the higher the temperature the greater the increase in color development per unit time increase. In other words, the greater the heat input (a function of time and temperature) the greater the proportion of the oxidant that is activated and the greater the amount of color produced. Since polymerization requires a smaller proportion of activated oxidant (when the oxidant is also a polymerization initiator), fixing (deactivating the color-forming system against ambient light and temperature conditions) requires a smaller heat input. In general fixing temperatures are at least 10° –25° less than the color-forming temperatures.

Heating to the conversion temperature for imaging or fixing may be effected in several ways. Substrate bearing the image-fix composition can be passed around a heated bar or between heated squeeze rolls. Ovens may be used when heating large objects. Infrared lamps are suitable both for imaging and fixing. When fixing with heat lamps that also generate imaging wavelengths of light, suitable light filters can be used therewith. When heat imaging is effected first, the heat must be applied in a graphic pattern, as through stencils in conjunction with an infrared lamp, particularly when the pattern is large. Thermographic methods of reproduction are also satisfactory for heating in a graphic pattern. Representative methods and apparatus are described in U.S. Pat. Nos. 2,740,895 and 3,089,952.

Electron beam fluxes for imaging and fixing can also be determined by trial, the optimum conditions depend on the formulation and its thickness, the electron beam energy and the exposure time. Beams having average electron energies as low as about 10 kilovolts and as high as about 2 million electron volts have been used successfully.

X-rays may be used as a single source of energy or in combination with a phosphor screen that emits UV radiation on being struck with x-rays. Because X-ray dosages required to effect the color-forming reaction are not normally available, X-ray exposures are used herein for deactivation. The dosage depends on the particular formulation and its thickness, and is readily determined by trial. Phosphor screen use helps minimize the dosage required. In one embodiment, film bearing an image/fix composition as described is placed over the phosphor screen, and the film is irradiated with X-rays from the side way from the film. The X-rays that pass through the film strike the screen, emitting UV radiation which is reflected back up through the film, thus initiating the polymerization reaction.

The imaging and fixing radiations may be mixed. They may be different for each step or they may be used in combinations such as light and heat, or heat and electron beam in the same imaging or fixing step.

Photoimaging is the preferred imaging step in the process of this invention, particularly with actinic radiation rich in 200–400 $\mu$ wavelengths. Photofixing is the preferred fixing step means (with either actinic radiation rich in the 200–400 $\mu$]range or with visible light rich in the 450–650 range); however, important embodiments involve fixing with heat, electron beams and combinations thereof, especially heat and light simultaneously applied.

With image-fix compositions containing components that are thermally activatable at relatively low temperatures (e.g. certain hexaarylbiimidazoles and tetraarylhydrazines described above) or tend to volatilize from the compositions (e.g. carbon tetrabromide, thermographic and microencapsulation techniques can be used to improve storage stability. To assure good storage stability orthosubstituted triaryl methane leucodyes described previously are used. In the thermographic techniques, as described in U.S. Pat. Nos. 2,663,654, 2,663,655, 2,663,655, 2,663,656, 2,663,657, 3,076,721 and 3,094,417. the activatable oxidant-polymerization initiator component and the leucodye are kept as physically separate layers and are brought together for intimate mixing when desired. Microencapsulation, described in U.S. Pat. No. 2,800,457, 2,800,458 and 3,015,128, involves encapsulating one or more of the reactants as small particles in protective jackets rupturable by heat or pressure. Thus the activatable oxidant and the color generator can be kept physically separated and prevented from reacting until heat or pressure ruptures the capsules and readies the composition for the sequential irradiation steps of this invention, including irradiation with radiation other then heat. With heat-activated image fix-compositions the activation temperature (which depends essentially on the structure of the oxidant) should be at least as high as that for rupturing the capsules. Heat for arming the system and for activating it for thermal imaging or fixing can be applied stepwise or simultaneously. When the imaging and fixing radiation is to be other than heat the arming temperature or frictional pressure should suffice to rupture the capsules and allow the reactants to mix but not to activate them for color formation.

G. Usefulness of the Invention

The process of this invention is broadly useful where substantially permanent images are desirable as in photography, pattern-making, reproducing written, printed, drawn or typed matter, and recording radiation signals as line graphics, alphanumerics or other characters. It provides negative or positive prints simply by changing the order of the two radiations; and it is adaptable to both transmission and reflex exposure techniques. The first applied radiation can be passed through stencils, negatives or transparencies including halftone and continuous tone negatives and positives, in contact with or projected onto the radiation-sensitive image-fix composition; or, it can be reflected for impingement on the radiation-sensitive material from printed or typed copy or objects that are opaque or transmit radiation poorly. Similarly, image of objects having areas differing in absorption and transmission characteristics are captured by placing the objects between the first radiation source and the radiation-sensitive material surface. Radiation-transparent assemblies comprising image-fix composition, supporting substrate and cover film, when used, can be stacked for multiple copying with single imaging and fixing exposures.

Because the image-fix compositions are essentially grainless and the rigidifying polymerization immobilizes the exposed imaged as well as fixed portions, the process of this invention affords prints with good contrast between imaged and fixed areas, high resolution and excellent resolution retention. The process is thus particularly useful for recording data where large reductions in image size are desired, for example such microforms as microfiches, microchips, aperture cards and roll film bearing the image-fix compositions. Since the image-fix compositions have good storage stability before and after irradiation as well as good image retention before final fixing, the sequential irradiation method allows one to periodically add information bits to the radiation-sensitive material over long time periods, and finally to fix the image without having to mechanically or chemically treat the microform. In one method, a photosensitive microform is exposed to the information to be copied through a lens system. The relatively low intensity ambient light that strikes the photosensitive surface in this image capture step creates a latent image (i.e. the exposed areas are polymerized but uncolored). To develop the latent image, the entire surface is exposed to high intensity light, which results in color as well as polymer formation. It will be appreciated that the captured latent image can be read if desired before the final high intensity light exposure by physical no-contact e.g. optical means that sense differences in properties, e.g. light refractivity, between the polymerized (exposed) and unpolymerized (unexposed) areas. For example, an image-fix composition containing a hexaarylbiimidazole, leucodye and an acrylate ester monomer as described previously can be imagewise exposed with a pulsed nitrogen laser peaking at 337 $\mu$ and the resulting image read out as differences in refractivity between the exposed and unexposed areas with a helium neon laser emitting at 633 $\mu$, such long wavelength light being effective to sense the refractivity differences but not effective to initiate either the imaging or polymerization reactions.

Some image-fix compositions are tacky and adhere to various surfaces. When polymerized, by imaging or fixing radiation, the compositions adhere so strongly as to become integrally bonded to such substrates as glass, cellulosics, ceramics, leather, plastics and metals. Some materials, e.g. polypropylene, do not become bonded and are strippable from the imaged and fixed surfaces. Thus, the process of this invention is useful to bond graphic patterns to the surfaces of bondable substrates including facing surfaces in sandwiched structures. For example, labeling a glass bottle comprises coating a polypropylene film with image-fix composition, pressing the uncovered surface to the glass surface, thereby producing a laminate wherein the bottle is the substrate and the film the cover, stencilling or projecting the message onto the surface film, sequentially irradiating according to the invention to create the image, and stripping off the cover film, which leaves the image, adhering to the glass. The carrier/cover film need not be strippable; with polyethylene terephthalate, which is bondable, the film becomes part of the label. Similarly, on bondable laminates comprising the image-fix composition sandwiched between bondable glass plates or polymeric films, at least one of which is radiation-transparent and preferably at least one is adequately stiff for handling by sorting machines, such as those used for aperture cards, can be optically exposed, e.g. as described for the microforms above, to provide permanent unalterable records. Where desired, the image can be built up in stages, i.e., "added-on" over a period of time before fixing, by multiple exposures with the same or different patterns. Also, to create variable optical density effects, the image buildup capability can be limited before imaging and final fixing by prior exposure to fixing irradiation at a fraction of the exposure required for a complete fix. Such limited radiation exposure just prior to deactivation also serves to eliminate the oxygen-induced induction period and thus speed up the deactivation step.

The image-fix compositions may be employed in the method of this invention as unsupported films or as impregnates in or coatings on suitable supports which may be transparent, translucent or opaque, flexible or rigid, flat or curved. Included are film, paper, cardboard, fiber board, wood, 3 4 and plates, ceramic and glass plates, woven and nonwoven textiles, resins, plastics and the like. Film supports are preferred, including polyethylene, polypropylene, vinylidene and vinyl polymers and copolymers including polyvinyl chloride, polyvinylidene chloride, vinyl chloride/vinyl acetate, vinyl acetate/acrylate, vinyl acetate/methacrylate, vinylidene chloride/acrylonitrile, vinylidene chloride/vinyl acetate, vinylidene chloride/methacrylate, polystyrenes, polyvinvyl acetals including polyvinyl butyral, polyvinyl formal, polyvinyl alcohol, polyamides including polyhexamethylene adipamides, butadiene-acrylonotrile elastomeric copolymers, polyacrylate polymers and copolymers including polymethymethacrylate, polyethymethacrylate, polyurethanes, polycarbonates, polyethylene terephthalate, cellulose ethers and esters including methyl cellulose, ethyl cellulose, benzyl cellulose, cellulose acetate, cellulose triacetate, cellulose propionate and cellulose nitrate. Polyethylene terephthalate, cellulose acetate, cellulose acetate butyrate, polyvinyl alcohol and polyvinyl butyral films which are transparent to UV wavelengths at least as low as 300 $\mu$ and higher into the visible are particularly preferred supports. The image-fix compositions are conveniently applied to the substrates as solutions in volatile solvents such as those described above. For example, they may be coated on roll film utilizing such typical devices for continuously laying down wet films as nip fed three roll reverse roll coating heads, gravure coaters, trailing blade coaters and Mayer bar coating heads (wherein the coating thickness is controlled by a threaded or a wire wound bar). The wet thickness is adjusted such that the dry thickness after solvent removal is in the desired range (about 0.1–1.5 mil, usually around 0.8–1.1 mil thick). After the solvent has been removed, as by radiant heating or forced air evaporation, the coated film is wound up on rolls in the usual way.

The photosensitive coatings are often advantageously covered with radiation-transmitting materials. Thus they may be laminated between a substrate and a cover film, paper or plate which is transparent to the imaging and fixing radiation.

Oxygen tends to retard the fixing step by inhibiting the addition polymerization reactions. It is accordingly desirable to cover the image-fix compositions (and thus sandwich them between the cover and support materials) with film, foil, membrane or glass plate that is transparent to the radiations to be used and is substantially impermeable to air, particularly during the exposure sequence. Cover films are preferred and include regenerated cellulose, cellulose acetate, cellulose propionate, polyvinyl alcohol, and polyethylene/polypropylene, polyvinylidene/acrylonitrile, polymethyl methacrylate, and polyethylene terephthalate films. Photographic film, e.g., silver negatives, may also serve as the cover film. Alternatively, the compositions are stored under nitrogen or other inert nonoxygen atmosphere. Such conditioning, for 24 hours or more, is often beneficial for the intert gas tends to displace the oxygen originally contained in the composition. Also, as mentioned above, the $0_2$—effect can be eliminated through controlled prior exposure. Thus, polymerization occurs more rapidly under fixing conditions. When the polymerization is so rapid that the desired readout density cannot be fully developed during the image step, owing to the rapid concomitant polymerization which rigidifies the composition prematurely, it is desirable to first expose the composition to oxygen or air so as to allow some oxygen to diffuse into the system and exert a mild inhibitory effect, in the form of a slight induction period, whereby the full imaging density can be developed with only slight sacrifice in the fixing speed.

It will be appreciated from the above that the energy required to effect the polymerization fix can be divided into a part to overcome the induction period and a part to complete the polymerization reaction. The limited irradiation exposure to eliminate the induction period of the polymerization reaction can be controlled so as not to adversely affect the imaging capability, e.g., maximum attainable optical density of the color-forming composition. Such controlled irradiation can be applied as preirradiation just prior to the deactivation step itself when such step follows the imaging, e.g., color-forming step, or if deactivating radiation is applied first patternwise for latent imaging, the dosage corresponding to the amount required to overcome the induction period can be applied afterwards, patternwise or not, before the composition is irradiated to develop the latent image.

In the method of this invention the images to be recorded may be captured as direct or latent images using various devices for optical printing. With an image/fix compositions containing an hexaarylbiimidazole/leucodye system as described herein entire sheets may be printed as a complete format instantly, or as composite information consisting of lines, characters or bits printed in sequence. These images are instantly visible and can be readout by suitable optical devices. Photographic masks may be used for printing fixed format data such as lines, maps, plots, graphic and alphanumeric information. Variable information may be printed by creating individual characters serially or by printing information by a series of individual lines or dots. This may be accomplished by using a mask operated by electrostatic and/or magnetic devices. A narrow light beam having a digitally modulated scan such as a raster may be used to create images. Transfer of such information from the masks or light pattern generating mechanism can be accomplished using contact or projection printing techniques. By suitable sequence of exposures either light printing on a dark background or dark printing on a light background or a combination of both can be obtained.

The image/fix method of this invention may be utilized in roll-to-roll duplication of a maSter film onto the photosensitive paper or film referred to below as copy material. By master film is meant a original image capture film or a copy of a capture film which may be a silver, diazo or Kalvar image, or a dye image produced from hexaarylbiimidazole/triarylmethane leucodye, or other transparent photographic product which can be duplicated. In roll-to-roll duplication, the master film and the copy material bearing an image/fix composition as described herein are fed from supply reels to a juncture station where suitable guides and tension rollers, well known to the duplicating art, position the two materials and hold them in contact. The two superimposed materials then pass to a first station where they are exposed to a first irradiation using one or more suitable radiation sources described elsewhere herein, to effect transfer of the master image to the copy material. During this exposure drive mechanisms and guide rollers known to the art may be used to move the two materials in contact and in registration for high resolution image reproduction. After leaving the first irradiation station the master film and the copy material are separated. The copy material is sent to a second irradiation station where it is irradiated again in accordance with the method of the invention. If the image capture step at the first irradiation station involves direct image formation, e.g. color formation as by exposure to UV light, to yield a negative image of the master, then the second station provides the deactivating radiation required to fix the image. If, however, the image capture step at the first station involves irradiating with deactivating radiation to form a latent image, then the second radiation at the second station will be radiation required for direct image, e.g. color formation, and the image produced on the copy material will be a positive image of the master. The two stations may contain two or more radiation sources and variable intensity sources so as to provide negative-working or positive-working images on demand.

As indicated above the stations may be equipped with means for masking the copy material so that only a portion thereof is imaged and deactivated on passing through the two irradiation stations; thus information may be added onto the copy material at a later time by repeating the operation with another master film. Also, if necessary and desired, the copy material may be preirradiated, to overcome the oxygen induced induction period as described previously, before it enters the first, image capture station; or in the method of making positive images it may be post-irradiated at or after it leaves the first irradiation station. Finally the copy material is wound onto a takeup reel.

The master film, on being separated from the copy material after leaving the first irradiation station, may be rewound on a takeup reel or returned to the first station to form a loop. Loop operation permits continuous rerun of the master film for multiple duplication.

The above system can readily be adapted to handle master film in sheet form for sheet-to-roll duplication, or the copy in sheet form for roll-to-sheet duplication, or both master and copy in sheet form for continuous sheet-to-sheet duplication. The sheets may be film units such as aperture cards, microfiches or microjackets, or the sheet forms of the various duplicatable film products described above as masters for roll-to-roll duplication.

The process of this invention can also be used in cathode ray tube printout systems. In such systems, information to be recorded, which may originate from a computer, radar camera, infrared camera, television camera or other central source is fed to a command unit which transmits the information as signals that the cathode ray tube can utilize. The radiation-sensitive materials used in the process of this invention are transported past the face of the cathode ray tube while the emitted radiation from the cathode ray tube impinges in signal form upon the radiation-sensitive material. The emitted radiation intensities of the tube can be controlled by varying the anode acceleration potential, electron beam screen current, beam focus (diameter) or beam writing velocity or dwell time. Thus the cathode ray tube can be employed to produce either imaging or fixing radiation for use in the process of this invention.

H. Examples

The following examples illustrate the invention with various radiation-sensitive materials and describe various sets of imaging and fixing conditions. Unless otherwise stated, deactivation (or fixing) means that the systems's color-forming potential has been decreased to such an extent that the color optical density resulting when the deactivated system is exposed to a contact flash from a xenon flash lamp is substantially less than that produced under the described imaging conditions. The xenon flash lamp, which is sometimes used for imaging in the following examples, is available as Hi Co lite, and emits ultraviolet and visible light approximating sunlight at an intensity of about $1\times10^5$ milliwatts/cm.$^2$ for about 0.001 second flash duration.

Example 1—Photoimage/Thermal Fix

Polyvinyl chloride film was impregnated, by soaking with a solution containing the following ingredients:

| Ingredient | Parts | Moles |
|---|---|---|
| 2,2′-bis(o-chlorophenyl)-4,4′, 5,5′-tetraphenyl biimidazole (o-Cl-HABI) | 0.033 | $5\times10^{15}$ |
| tris(p-N,N-diethylamino-o-tolyl)methane | 0.050 | $1\times10^{14}$ |
| p-toluene sulfonic acid | 0.057 | $3\times10^{14}$ |
| pentaerythritol triacrylate | 1.98 | $6.6\times10^{12}$ |
| azo bis-isobutyronitrile | 0.02 | $1.2\times10^{14}$ |
| cellulose acetate | 1.2 | |
| acetone | 13.0 | |

The film was heated at 75° C. under an IR lamp to remove the acetone. The imaging step was carried out by irradiating one-half the film by contact-flashing with a Xenon flash lamp to produce a deep blue color. The entire film was then deactivated (or fixed) by heating for 45 seconds at 150° C. Substantially no color formed. Subsequently, contact-flashing the heated area with the Xenon lamp developed no color. The image was therefore fixed.

To show that the image was rigidification fixed, i.e., that the imaging components had not been destroyed but were immobilized in the polymerized matrix produced on heating, the imaged and fixed film was swelled in an acetone/dimethyl acetamide mixture and reirradiated with the imaging lamp. The previously uncolored fixed area became substantially colored.

Example 2—Two Wavelength Photoimage/Photofix/Quinone as Polymerization Initiator An acetone solution containing the following ingredients:

| Ingredient | Parts | Moles |
|---|---|---|
| o-Cl HABI (as in Example 1) | 0.035 | $5.3\times10^{15}$ |
| tris(p-N,N-diethylamino-o-toly) methane | 0.013 | $2.6\times10^{15}$ |
| p-toluene sulfonic acid | 0.010 | $5.3\times10^{15}$ |
| pentaerythritol triacrylate | 0.030 | $1\times10^{12}$ |
| pyrenequinone (approx. equimolar 1,6 and 1,8-isomers) | 0.0013 | $5.5\times10^{16}$ |
| trimethyl nitrilotripropionate | 0.30 | $1.1\times10^{13}$ |
| polyvinyl pyrrolidone | 0.25 | |

was cast as a 1-mil film on a "Mylar" polyester support film and covered with 3 mil thick polypropylene film transparent to actinic wavelengths above 300 μ.

The film was imaged by covering it with a Corning 7–54 filter (transmitting from about 240 to 420 μ, maximally at about 340 μ) and a stencil, then contact-flashed once with the Xenon lamp described in example 1, producing a deep blue image. The stencil was removed, the filter replaced with a Corning 0–51 filter (transmitting above 350 μ and showing 60% or higher transmission above 400 μ) and the film irradiated in the fixing step with a single flash of the Xenon lamp held about 6 inches from the film surface, whereupon substantially no color developed. Reexposing the thus-fixed area to the Xenon lamp's full intensity and light range, with the filter removed, again produced little or no color, demonstrating the fix.

Replacing the unsaturated triacrylate with pentaerythritol tripropionate, its saturated analog, yielded a composition which could be imaged under the above conditions but not fixed. This demonstrates that fixing depends on the polymerizable triacrylate and indicates that the quinone functions as polymerization initiator and the nitrilopropionate as a chain transfer agent in the fixing step, the quinone's concentration being too low to adequately fix either of the above compositions by the photoreduction fixing method of U.S. Pat. application Ser. No. 534,591 filed Feb. 17, 1966, cited earlier.

Example 3—Two Wavelength Photoimage/Photofix/Reducible Dye as Polymerization Initiator A laminated article containing a radiation-sensitive material was prepared as in example 2 except that Erythrosin B (20 mole/mole o—Cl—HABI) replaced the quinone as the visible light activated polymerization initiator. The composition was imaged by irradiating with intense ultraviolet light through a 7–54 filter, as described in example 2, and fixed by irradiating through a Corning 3–71 filter (transmitting visible light above 460 μ) with a 275 watt sunlamp (Westinghouse RS type) held 8 inches from the surface.

Examples 4–7—Intensity-Controlled Photoimage/Photofix

A mixed acetone/ethanol solution containing

| Ingredient | Parts | Moles |
|---|---|---|
| o-Cl-HABI | 0.059 | $9\times10^{15}$ |
| tris(p-N,N-diethylamino-o-tolyl) methane | 0.023 | $4.5\times10^{15}$ |
| p-toluene sulfonic acid | 0.017 | 9×10'5 |
| trimethyl nitrilopropionate | 0.38 | $1.4\times10^{13}$ |
| polyvinylpyrrolidone, mol. wt. 40,000 | 0.25 | |
| polyvinylpyrrolidone, mol. wt. 360,000 | 0.25 | |
| pentaerythritol triacrylate | 0.50 | $1.7\times10^{13}$ |

was coated to a 1-mil dry thickness on 2-mil polypropylene, the carrier solvent being evaporated by drying for 30 minutes under an infrared lamp positioned 12 inches from the surface so as to not raise the temperature above 50° C., and the substantially dry coating covered with 5-mil "Mylar" polyester film to form a laminate.

Fixed continuous tone nonreversal prints were made by (*a*) exposing the laminate through a continuous tone photographic transparency (either negative or positive) and through the polypropylene film under the fixing conditions tabulated below then (*b*) with the stencil removed exposing the entire surface to a single contact flash, i.e. close-to-the surface flash, of the Xenon lamp described in example 1:

| Example | Low Intensity UV Source and Exposure |
|---|---|
| 4 | A single flash of the Xenon flashlamp positioned 12 inches from the surface |

| | |
|---|---|
| 5 | 5 seconds exposure to a 275-watt sunlamp 8 inches from the surface |
| 6 | 10 seconds exposure to a Metalarc lamp 10 inches from the surface |
| 7 | 90 seconds exposure to a fluorescent desk lamp 2 inches from the surface |

Reversing the exposure order in the above examples yielded equally satisfactory fixed continuous tone watt prints.

Example 8—Intensity-Controlled Photoimage/Photofix/Projected Image

A transparent microfilm image was projected from a slide projector containing a 500 watt bulb onto the surface of a previously unexposed laminate prepared as in examples 4–7 and positioned with its polypropylene film side facing the bulb at a 3–4 foot distance from the bulb. This exposure created a latent image in 1–3 minutes. One contact flash of the Xenon lamp over the entire surface developed the fixed image as a 5–6 times enlargement of the original.

Example 9—Photoimage/Photofix. Neutral Shade Image

A film laminate was prepared as in examples 4–7 except that bis(N,N-diethylamino-o-tolyl) 3,4-methylene-dioxyphenyl methane was employed as the leucodye in place of the tris-(p-N,N-diethylamino-o-tolyl)methane. Imaging with a Xenon flash and fixing by exposure to the sun lamp of example 5 for 10 seconds at a 10-inch distance gave a fixed grey-black image.

Examples 10 to 13—Light Image/Heat Fix and Heat Image/Heat Fix

A formulation containing 0.35 g. of 2,2′-(o-chlorophenyl)-4,4′,5,5′-tetrakis (m-methoxyphenyl)biimidazole, 0.228 g. of tris(p-N,N-diethylamino-o-tolyl)methane, 0.124 g. of p-toluene sulfonic acid, 2.5 g. of pentaerythritol triacrylate, 1.1 g. of poly(methyl methacrylate) and 5 ml. of acetone was coated to a 5-mil wet thickness on 1-mil "Mylar" polyester film, warmed slightly under an IR lamp to evaporate the acetone, and laminated with a 4-mil "Mylar" cover sheet.

The laminate was subjected to imaging and deactivation steps as follows: Imaging involved either (a) heating at 130° C. for 2 minutes or (b) exposure to a single Xenon lamp flash at 25° C. Deactivation involved (a) heating unexposed portions of the film at 90° C. for 4 minutes or (b) heating at 65° C. while irradiating with light at 0.1 mw/cm.$^2$ for 30 seconds. The extent of deactivation to ambient light and temperature conditions was determined by flashing the thus treated area with the xenon lamp at 25° C. and measuring the extent of color formation. The results are tabulated below:

Transmission Optical Density

| Treatment | Example 10 | Example 11 | Example 12 | Example 13 |
|---|---|---|---|---|
| a. Light-activated imaging | 1.0 | 1.0 | | |
| b. Heat-activated imaging | | | .4 | .4 |
| c. Heat fixing followed by light exposure. | .1 | | .1 | |
| d. Heat and light fixing followed by light exposure. | | .1 | | .1 |

The results illustrate the versatility of the sequential exposure method of this invention in showing that the described composition can be converted to color by heat or light and deactivated against color formation by heat or light. The difference in optical density between the colored and deactivated areas indicates the relative effectiveness of the particular sequential operation to produce a stable colored image.

Example 14—Photoimage/Heat Fix

A formulation containing 0.32 g. of 2,2′-(o-chlorophenyl)-4,4′,5,5′-tetrakis (m-methoxyphenyl)biimidazole,0.13 g. tris(N-diethylamino-o-tolyl) methane,0.13 g. of p-toluene-sulfonic acid,0.005 g. of N-phenyl glycine, 1.32 g. of triethylene glycol diacrylate, 1.32 g. of cellulose acetate butyrate (available from Eastman as EAB 171—15) and 15 ml. of acetone was cast on and laminated between "Mylar" polyester film as described in examples 10 to 13.

The film was imagewise exposed to a xenon flash which produced a blue image (transmission optical density=0.8). Portions of the unexposed area were then heated at 90° C. for different times and the extent of heat-activated deactivation to light was determined by Xenon flashing the heat-treated segments. The results are tabulated below in terms of transmission optical densities of the imaged and deactivated and flashed areas.

| Test | 90° C. Heat-Treatment/Time, Seconds | Deactivated and Flashed Area O.D. | Difference between imaged O.D. and deactivated and Flashed O.D. |
|---|---|---|---|
| A | 15 | 0.3 | 0.5 |
| B | 30 | 0.1 | 0.7 |
| C | 60 | 0.07 | 0.73 |

Example 15—Visible Light-Sensitized Deactivation

A laminated film was prepared as in example 14 but with 1 mg. of 3,3′-diethyl selenacarbocyanine iodide also added to the coating composition. Contact-flashing with the Xenon lamp produced a blue image with 0.80 transmission optical density. Irradiating an unexposed portion of the film for 5 minutes with two 15-watt cool white fluorescent bulbs at a distance of 18 inches through a Corning 3–72 (430 $\mu$ cutoff) filter resulted in significant deactivation as evidenced by the fact that an optical density of only 0.25 was developed on further exposing the thus-deactivated film to an unfiltered Xenon flash. In a control run, the control film (containing no carbocyanine sensitizer) required a much longer time for deactivating with visible light.

Example 16—Photoimage at 100° C./Heat Fix at 100° C.

A composition containing 0.42 g. of 2,2′-bis(o-chlorophenyl-4,4′,5,5′-tetrakis(m-methoxyphenyl)biimidazole, 0.14 g. of tris(N,N-diethylamino-o-tolyl)methane, 0.1 g. of p-toluene sulfonic acid monohydrate, 1.8 g. of pentaerythritol triacrylate, 1.1 g. of trimethyl nitrilotripropionate, 1.5 g. of a 1:1 mixture of polyvinylpyrrolidones K30 and K90, and 6 ml. of ethanol was coated to a 5-mil wet thickness on 1-mil "Mylar" polyester film. The coating was dried on a rotating drum for 30 minutes under an IR heating lamp 2 inches away and the coated film was covered to form a laminate with 5-mil Mylar film.

The film was heated on a hot plate for 20 seconds at 100° C. and then contact flashed through a stencil while still on the hot plate, producing a deep blue image (O.D.=0.76). Heating unimaged film at 100° C. for 2 minutes fixed the film; (O.D.=0.12after subsequently flashing at 25° C.

Example 17—Photoimage/Photofix. Multiple flash exposure

The example 16 film laminate preparation was repeated with a composition containing 0.42 g. of the biimidazole of example 16, 0.41 g. of the tris(N,N-diethylamino-o-tolyl)-methane leucodye of example 16, 0.22 g. of p-toluene sulfonic acid monohydrate, 1.3 g. of poly(methyl methacrylate) having a 0.445 inherent viscosity, 3 g. of pentaerythritol triacrylate and 9 ml. of acetone. The laminate was imaged by exposing it imagewise to six consecutive Xenon lamp flashes; the optical density of the color produced increased progressively with each flash to a cumulative 1.35. The unexposed areas were then deactivated by a 30-second exposure to a Sylvania Sun Gun having a 3-inch diameter snoot, the lamp being 21 inches from the target.

Example 18—Photoimage/Photofix. Camera Use. Positive Print

The example 16 film preparation was repeated except that the dried coating on 1-mil "Mylar" polyester film was laminated with 10-mil Baryta paper, the paper's finished The film was placed in a 35 mm. camera with the polyester film surface facing the lens and exposed outdoors on a bright sunny day at 1.2 f. stop for 60 seconds. The resulting latent image was developed as a blue positive print by subsequently contact flashing with a Xenon lamp.

Example 19—Photoimage/Photofix

A laminated film was prepared as in example 14 except that 1.5 mg. of 3,6-bis(diethylamino)acridine hydrochloride [Diethyl Orange] was also added to the coating formulation. Contact-flashing with the Xenon lamp produced a blue image with 0.77 transmission optical density. Irradiating an unexposed portion of the film through a 430 μ cutoff filter as in example 15 resulted in deactivation of the thus-exposed area.

Substantially similar results are obtained with Dimethyl Orange, i.e., 3,6-bis(dimethylamino)acridine hydrochloride in this example.

Example 20—Photoimage/Photofix Light Intensification through Focusing

Unexposed film paper laminate of example 18 was exposed sequentially imagewise to focused and unfocused light from a continuously emitting Osram Xenon arc lamp. Focusing of the light beam to intensify it was achieved by placing a 35 mm. camera lens between the light source and the film target and varying its relative position between the two while observing the focal pattern through a frosted plate. Typical data follow:

| Exposure, Seconds | Focus | Film Distance from Lamp | Reflected O.D. |
|---|---|---|---|
| 2 | ¼ inch spot | 12 inch | 0.31 |
| 3 | ¼ inch spot | 12 inch | 0.38 |
| 1 | ⅛ inch spot | 14 inch | 0.66 |

The difference in O.D. is a readable difference. The ¼-inch spots (corresponding to lower exposures) are essentially fixed (deactivated against further photo imaging).

Example 21—Photoimage/Heat-Assisted Low-Intensity Photofix

A film laminate was prepared as in example 16 except that the trimethyl nitrilotripropionate component was omitted and the tris(N,N-diethylamino-o-tolyl)methane leucodye and toluene sulfonic acid concentrations were doubled in the photosensitive layer. The film was exposed to variable intensity monochromatic 365 μ light in a series of exposures while the irradiance was monitored with a radiometer. The measuring apparatus involved (a) a 200 watt super pressure mercury arc combined with a monochromator of band pass=about 100A (b) a quartz lens to image the monochromator aperture in the exposure plane, (c) a filter holder and iris diaphragm to control irradiance, (d) an electric timer controlled shutter and (e) a blackened aluminum stage with means for clamping the film sample behind a quartz plate.

Tabulated below are typical exposures for achieving a 1.0 or 1.4 transmission optical density blue image:

| Run | Intensity mw./cm.$^2$ | Time, Seconds | T.O.D. |
|---|---|---|---|
| A | 25 | 2 | 1.0 |
| B | 15 | 3 | 1.0 |
| C | 5 | 8 | 1.0 |
| D | 2 | 20 | 1.0 |
| E | 1 | 53 | 1.0 |
| F | 25 | 8 | 1.4 |

Runs A through E represent approx. equivalent imaging exposures (intensity-time) of about 40–50 millijoules/cm.$^2$.

The unexposed portions of the above film segments can be photo- or heat-deactivated as in the previous examples. They may be simply heated or exposed to low intensity light at room or somewhat elevated temperatures as tabulated below:

Deactivation Against Photo-Imaging

| Temp. °C | Time, Seconds | Light Intensity mw./cm.$^2$ |
|---|---|---|
| 85 | 1200 | 0.0 (dark) |
| 72 | 40 | 0.1 |
| 94 | 7 | 0.1 |
| 105 | 5 | 0.1 |

Either the color-forming step or the deactivation step can be applied imagewise. Thus it should be apparent that the above example indicates 48 sequential image/fix combinations that can be used with the deactivatable color-forming composition.

Example 22—Photoimage/Photofix

Film laminates prepared as in example 14 were imaged to transmission optical density of 0.8 by exposure to a Xenon arc flash as described previously. Unexposed portions were deactivated with no color formation by exposure to 365 μ light at a 0.23 mw./cm.$^2$ intensity for varying periods of time. The extent of deactivation was then determined by further exposing the thus-deactivated areas to the xenon flash. The results are tabulated below.

Low Intensity Deactivation

| Time Seconds | Total Energy absorbed, mj./cm.$^2$ (0.23 mw./cm.$^2$ × time) | Optical Density After Flashing |
|---|---|---|
| 1 | 0.23 | 0.70 |
| 2 | 0.46 | 0.56 |
| 3 | 0.68 | 0.33 |
| 4 | 0.90 | 0.12 |
| 8 | 1.8 | 0.04 |

The data show that deactivation is significant after 2 seconds exposure to the low intensity radiation and is substantially complete in 4 to 8 seconds (after about 1 to 2 mj./cm.$^2$ of energy has been absorbed).

Example 23—Photoimage/Photofix. Exposure Control

Film laminates prepared as in example 14 were exposed to variable intensity 365 μ light in a series of exposures as tabulated below.

| Intensity, mw/cm$^2$ | Time, seconds | Exposure, mj/cm$^2$ | Optical density | Imaged or deactivated |
|---|---|---|---|---|
| 1.23 | 16 | 20 | 0.00 | D |
| | 200 | 250 | .07 | D |
| 10.2 | 2 | 20 | .03 | D |
| | 25 | 250 | .18 | D |
| | 100 | 1000 | .24 | D |
| 23.2 | .8 | 20 | .06 | D |
| | 13 | 300 | .3 | I |
| | 43 | 1000 | .38 | I |
| 50 | .1 | 5 | .00 | D |
| | .2 | 10 | .07 | D |
| | 2.6 | 130 | .55 | I |
| 110 | .05 | 5.5 | .00 | D |
| | .1 | 11 | .08 | D |
| | .23 | 25 | .30 | I |
| | .7 | 80 | .60 | I |
| | 1.4 | 150 | .83 | I |

These data show that in this system (a) at least a certain intensity (23.2 mw./cm.$^2$) is required to obtain an image with 0.3 or greater optical density (b) the higher the intensity the greater the imaging capability, and (c) fixing as well as imaging can be achieved at the imaging intensities by controlling the exposure time.

That the exposed films designated D in the above table were essentially deactivated was determined by additionally exposing each film after a time lapse of about 60 seconds to 110 mw./cm.$^2$ intensity light for an indefinite period or to a Xenon lamp flash. The resulting optical densities indicated that even at the imaging intensities given above, complete deactivation is achieved by limiting the exposure time such that the total exposure is between 2 and 6 mj./cm.$^2$.

Example 24—Photoimage/Electron Beam Fix

Example 22 was repeated except for the deactivation step which was effected with an electron beam from a 2 MeV resonant transformer as follows: Film samples were placed 30 cm. from the transformer window on water-cooled lead plate targets. With the targets cooled by circulating water and blowing with air, the films were exposed to the beam at different beam currents and for varying periods of time. The extent of deactivation was then determined by further exposing the thus-deactivated areas to the Xenon arc imaging flash. The results are tabulated below, with the absorbed electron beam energies represented as millijoules/cm.$^2$:

Electron Beam Deactivation

| Beam Current, milliamps | Exposure Time, Seconds | Absorbed Energy, mj./cm.$^2$ | Optical density after flashing |
|---|---|---|---|
| 0.08 | 1 | 0.1 | 0.85 |
| 0.08 | 2 | 0.21 | 0.75 |
| 0.1 | 5 | 0.63 | 0.33 |
| 0.1 | 6 | 0.85 | 0.18 |
| 0.1 | 8 | 1.15 | 0.05 |
| 0.1 | 10 | 1.35 | 0.04 |
| 1.35 | 1 | 1.8 | 0.02 |

The results show that deactivation is substantial after 0.5 milliamp seconds exposure to the electron beam and is essentially complete in about 0.8 milliamp-seconds (after about 1 mj./cm.$^2$ of energy has been absorbed).

Example 25—Electron Beam Image/Electron Beam Fix

Film laminates prepared as in example 21 were exposed to 2 MeV electrons using the apparatus described in example 24. Imagewise exposure at 2 milliampere beam current for 40 seconds (160 mj./cm.$^2$ exposure) produced a blue 1.0 transmission optical density image. Irradiating the unexposed portion at 0.1 milliamperes for 20 seconds (45 mj./cm.$^2$) produced a substantially deactivated area with some color (T.O.D.=0.3).

Example 26—Photoimage/Photofix

A formulation containing 0.35 g. of 2,2'-(o-chlorophenyl)-4,4',5,5'-tetrakis (m-methoxyphenyl)biimidazole, 0.228 g. of tris(p-N,N-diethylamino-o-tolyl)methane, 0.124 g. of p-toluene sulfonic acid, 2.5 g. of 2-hydroxyethyl methacrylate, 1.1 g. of poly(methyl methacrylate) and 5 ml. of acetone was cast on 1-mil thick "Mylar" polyester film and warmed slightly under an IR lamp to evaporate the acetone. The photosensitive layer was covered with a 5-mil thick "Mylar" polyester film and exposed through a stencil, to one flash of the Xenon flash lamp described in example 1 to produce a 0.92 transmission optical density of the blue dye form of the leucotriarylmethane. The unexposed area was then deactivated by exposure to radiation from two 15 watt cool white fluorescent bulbs held 18 inches away for 25 minutes. Subsequently exposing the thus deactivated area to the xenon flash lamp resulted in a transmission optical density of only 0.15.

Example 27—Solid Monomer Use

Example 26 was repeated with 1.5 g. of p-xylene diacrylate in place of 2-hydroxyethyl methacrylate. Exposure to the xenon flash produced a deep blue color in the unmarked area. Subsequent exposure to a black light blue fluorescent lamp (0.7 mw./cm.$^2$, 356 $\mu$) for 2 minutes while heating at 65° C. resulted in substantial deactivation in the previously unexposed area.

Example 28—Divinyl Sulfone as the Monomer

Example 26 was repeated except that divinyl sulfone (1.0 g.) replaced 2-hydroxyethyl methacrylate as the monomer. One Xenon flash developed a 1.20 transmission optical density in the color-forming step. Exposure for 60 min. to two 15 watt cool-white fluorescent lamps held 18 inches away deactivated the composition such that only a 0.34 transmission optical density developed on subsequently exposing the deactivated area to a Xenon flash.

Examples 29-33

Film laminates were prepared as described in examples 4 to 7 except that the following ethylenically unsaturated materials replaced pentaerythritol triacrylate as the polymerizable monomer. Each film was imaged by contact flashing with a Xenon flash and deactivated by irradiating for 2 minutes with a low intensity light source providing an irradiance at the film surface of 0.72 mw./cm.$^2$.

| Example | Monomer |
|---|---|
| 29 | N-vinyl carbazole |
| 30 | styrene |
| 31 | 2-vinyl naphthalene |
| 32 | tetramethylene vinyl ether |
| 33 | hexamethylene vinyl ether |

Example 34—Wavelength Dependent Image/Fix

A laminated film prepared as in example 14 was covered in part by a Corning 3-72 (430 $\mu$ cutoff filter) and contact-flashed 3 times in rapid succession with the Xenon flash lamp. The uncovered area was deep blue, the covered area substantially colorless (O.D=0.10). That the area exposed to the filtered radiation was substantially deactivated against photoimaging was shown by exposing it after 30 seconds to unfiltered flash whereupon the area remained practically colorless (O.D.=0.22).

Similar results are obtained with a 3-73 filter which cuts wavelengths below about 400 $\mu$. The thrice-flashed area is somewhat less deactivated, however, giving a slight blue coloration (O.D.=0.31) on exposure to an unfiltered flash.

In this example, fixing is effected by irradiating the material in a region in which the biimidazole absorbs weakly. This activates sufficiently for polymerization initiation but not enough for color-formation. This example employs the same material as used in example 22 which uses the same overall wavelength range for both imaging and fixing but at different exposures. The same material is used in examples 15 and 19 which also utilize long wavelength light for fixing. The difference is that they also employ a photosensitizer which fixes faster.

Example 35 Photoimage/Photofix X-ray and Positive Transparency

Phosphor Screen

The example 14 film laminate was placed over a U.S. Radium X-ray screen coded PF (peak output 4200A.) A microswitch was placed over this film, partially covering it. The combination of the microswitch, film laminate and the phosphor screen were exposed to an X-ray source of 120 kv.

and 5 milliamps peak output for 4 minutes. The microswitch was then removed and the film exposed to a contact flash from a pulsed xenon lamp, yielding a blue image of the microswitch having an optical density range of 0.2–0.7 upon a substantially colorless background.

Satisfactory results may also be obtained by omitting the radium screen and exposing the film directly to the above X-ray source for about 25 minutes.

Example 36

Photoimage/Photofix Reflex Copy Positive Transparency

The example 14 film laminate was placed in intimate contact with white paper containing black printing so that the printed side faced the film. Light from a 500-watt projection lamp at a lamp-to-surface distance of 24 inches was allowed to pass through the film onto the paper for approximately 3 seconds. The substantially colorless film was then exposed to a high-intensity pulsed xenon lamp. The film in contact with the black printing yielded a blue positive image having approximately 0.3 higher optical density than the background. The printing was clearly readable by direct or projection viewing.

Fixed image formation under the above conditions is rationalized as follows: the light that passed through the film and struck the paper's white surface was reflected back up through the film for a second exposure, whereas the light that struck the printed areas was substantially absorbed by it. Thus the total exposure of the film to the low intensity light (insufficient for color formation) in the areas overlying the light-reflecting white background was about double that of the areas overlying the light-absorbing printed matter. As a result (1) the "-doubly-exposed" film areas were polymerized to a substantially greater degree than the "singly-exposed" areas over the printed matter and (2) the areas over the printed matter had not been completely fixed by the "single-exposure," as evidenced by the fact that subsequent exposure of the film to the high-intensity color-forming light produced enough dye molecules in the singly-exposed areas to provide a readable optical density difference between the printed matter captured on the film and the background.

Example 37

Photoimage/Photofix Blowback Positive Transparency

The example 14 film laminate was exposed in a Caps-Jeffree enlarger to a projected image of a 35 mm. film in an aperture card for 2 seconds. The resulting latent image was developed to an intense blue color by subsequently contact flashing with a pulsed xenon lamp thereby yielding a 20-fold nonreversal enlargement.

I Advantages of the Process of This Invention

As can be seen by the foregoing discussion, the advantages of the process of this invention are:

1. The fixing step is broadly useful with imaging systems that depend for readout product (e.g., dye molecule) formation on intermolecular reaction involving two or more reactants (e.g., leucodye and activated photooxidant) and thus are subject to diffusion control; that is, the composition can be adjusted such that the more viscous the medium, the slower the rate of readout product formation.

2. Addition-polymerizable systems comprising monomers with and without added initiators are well-known and readily available, including di- tri- and higher polyfunctional cross-linkable monomers and initiators activatable by a wide variety of activating means.

3. The radiation-sensitive imaging compositions and radiation-sensitive polymerizable monomers are generally physically, chemically and radiationally compatible and may be formulated and coated on various supports as substantially dry multiradiation-sensitive layers requiring no mechanical or chemical aftertreatment for image development.

4. There may be used activatable components that can react intermolecularly as part of an imaging system as well as initiate the chain reaction of an addition polymerization system. Thus, the method of this invention provides for imaging and fixing control by regulating the concentration of the activated component, through either radiation-intensity control or radiation-wavelength control or radiation-exposure time control.

5. The fixing step does not depend on transforming one or more of the imaging components completely into inactive compounds. Thus, the fixing and imaging systems may function independently of each other, although as indicated, they may share a common reactant.

6. The order of exposure can be varied to prepare negative-working images (by imaging first, fixing second) or positive-working images (by fixing first, i.e., latent-imaging, imaging second).

7. The readout product can be read with noncontact physical, e.g. optical, means before or after fixing so that imaging can be effected all at once or in stages. This add-on capability of unexposed as yet unfixed areas is important for recording information over a period of time.

8. Addition-polymerization rigidification fixing affords short access times to imaged documents.

9. Roomlight is effective for fixing many of the radiation-sensitive materials described herein.

10. The method applies to panchromatic systems, imageable and fixable over wide wavelength ranges.

11. The imaged and fixed areas show good contrast, resolution (since the compositions are grainless), and resolution retention (since the adjacent imaged and fixed areas are rigidified), all important in preparing reduced size images as in microfilming. Also, as both the imaged and fixed areas are normally polymerized, the sequentially exposed material in general exhibits desirable physical and chemical properties characteristic of the polymer, such as resistance to mechanical deformation, abrasion, atmospheric conditions, solvents and other chemical agents, important in preparing permanent records, labels, etc.

12. Thus there may be provided under the concept of this invention, highly versatile image-fix systems of wide utility capable of yielding a wide range of readout effects and capable of being activated for imaging and fixing against further imaging by sequential irradiation only, including irradiation with such important energy means as actinic radiation, infrared radiation, electron beams and X-rays.

The preceding representative examples may be varied within the scope of the present total specification disclosure, as understood and practiced by one skilled in the art, to achieve essentially the same results.

The foregoing detailed description has been given for clearness of understanding only and no unnecessary limitations are to be understood therefrom. The invention is not limited to the exact details shown and described, for obvious modifications will occur to those skilled in the art.

The embodiments of the invention in which an exclusive property or privilege is claimed are defined as follows:

1. A method for producing and fixing an image which comprises

A. providing a layer of a radiation-sensitive image recording material comprising 1. a multicomponent, intermolecularly reactive imageable composition comprising a. a leucodye b. an organic oxidant activatable by a first hereinafter called imaging radiation, said leucodye being intermolecularly reactive with the activated organic oxidant to produce a characteristic readout product, the greater the concentrations that diffuse together and react the greater the concentration of the readout product produced, said leucodye and said organic oxidant being present in amount sufficient to produce said product in a substantial readout amount when the organic oxidant is activated, 2. an ethylenically unsaturated addition-polymerizable monomer which is different from said leucodye of the imageable composition, is a plasticizer for the imageable composition, and is polymerizable to a substantially rigid polymer when the radiation-sensitive material is irradiated with a second hereinafter called fixing radiation, said monomer being present in such amount that
i. the radiation-sensitive material, with the monomer substantially unpolymerized, is sufficiently fluid to allow the leucodye and the organic oxidant, when activated by said imaging radiation, to diffuse together and produce a readout amount of said readout product, and
ii. the radiation-sensitive material is substantially rigidified when the monomer has been substantially converted to its polymerized form and the diffusion of said reactants is substantially retarded therein, and
3. an addition-polymerization initiator which is activatable by said fixing radiation, may be the same as or different from the organic oxidant, and when the same as that organic oxidant is further characterized in that the greater the exposure to the imaging radiation, the greater the proportion of said initiator that is activated as determined by increased readout product formation at increased intensities and exposures, and optionally a polymeric binder transparent to the imaging and fixing radiation, B. exposing the radiation-sensitive material to said imaging radiation and to said fixing radiation, in any order, with the first applied patternwise,
1. the imaging step comprising irradiating the material with said imaging radiation sufficient in intensity and exposure time to activate said organic oxidant in an amount sufficient to produce a readout amount of said readout product in the exposed areas,
2. the fixing step comprising irradiating with said fixing radiation such that the polymerizable monomer is polymerized substantially without effecting the reaction of the leucodye and activated organic oxidant, thereby producing rigidified areas that contain less of the readout product than the areas exposed to the imaging radiation, the area thus exposed being substantially fixed in that, owing to the substantially decreased diffusion of the leucodye and activated organic oxidant in the rigidified area, readout product formation is substantially prevented when such area is subsequently reexposed to the imaging or fixing radiation, and with the provisos
a. when the imaging radiation is also effective for said polymerization, the components of the radiation-sensitive material and the imaging exposure conditions are selected such that the readout product formation rate is sufficiently fast relative to the polymerization rate to produce a readable amount of the readout product, and
b. when the fixing radiation is also effective to activate the organic oxidant, the components and the fixing exposure conditions are chosen such that the polymerization proceeds to said fixing extent before substantial readout product formation occurs, and C. reading out the image in terms of the difference in readout product concentration between the imaged and fixed areas.

2. The method of claim 1 wherein:
the radiation employed in the imaging step and the fixing step is selected from the following imaging/fixing sequences, actinic light/actinic light, actinic light/heat, actinic light/electron beam, electron beam/electron beam, actinic light/X-ray and electron beam/X-ray;
the leucodye is converted to the readout product by oxidation;
the organic oxidant (1)(b) and the polymerization initiator (3) are the same and are a 2,2',4,4',5,5'-hexaarylbiimidazole wherein the aryl groups are phenyl, biphenyl, naphthyl, furyl or thienyl; and
the polymerizable monomer (2) is a terminally ethylenically unsaturated addition-polymerizable organic monomer.

3. The method of claim 2 wherein:
the leucodye is selected from the class consisting of aminotriarylmethanes, aminoxanthenes, aminothioxanthenes, amino-9,10-dihydroacridines, aminophenoxazines, aminophenothiazines, aminodihydrophenazines, aminodiphenylmethanes, leucoindamines, aminohydrocinnamic acids (cyanoethanes, leucomethines), hydrazines, leucoindigoid dyes, amino-2,3-dihydroanthraqueinones, phenethylanilines, 10-acylaminodihydrophenazines, 10-acyl-aminophenothiazines, 10-acyl-aminophenoxazines and amino-triarylmethanes wherein the methane hydrogen has been replaced by an alkylthio, benzylthio, 2-phenylhydrazino, or alkoxycarbonyl group; and
the 2,2',4,4',5,5'-hexaarylbiimidazole is one wherein the aryl groups are carbocyclic which can contain, as substituents, chlorine, bromine, fluorine, lower alkyl or lower alkoxy.

4. The method of claim 3 wherein
the leucodye is a salt of an acid and an aminotriarylmethane wherein at least two of the aryl groups are phenyl groups having (a) an $R_1R_2N$-substituent in the position para to the bond to the methane carbon atom wherein $R_1$ and $R_2$ are each groups selected from hydrogen, $C_1$ to $C_{10}$ alkyl, 2-hydroxyethyl, 2-cyanoethyl, benzyl or phenyl, and (b) a group ortho to the methane carbon atom which is selected from lower alkyl, lower alkoxy, fluorine, chlorine, bromine or butadienylene which when joined to the phenyl group forms a naphthalene ring; and the third aryl group may be the same as or different from the first two, and when different is selected from thienyl, furyl, oxazylyl, thiazolyl, indolyl, benzoxazolyl, benzothiazolyl, phenyl, naphthyl, pyridyl, quinolyl, indolinylidene, or such aforelisted groups, substituted with lower alkyl, lower alkoxy, methylenedioxy, fluoro, chloro, bromo, amino, lower alkylamino, lower dialkylamino, lower alkylthio, hydroxy, carboxy, carbonamido, lower carbalkoxy, lower alkylsulfonyl, lower alkylsulfonamido, $C_6$ to $C_{10}$ arylsulfonamido, nitro or benzylthio;
the hexaarylbiimdazole is a 2,2',4,4',5,5'-hexaphenylbiimidazole wherein the 2 and 2' phenyl groups have a substituent in the position ortho to the carbon of the phenyl group bonded to the biimidazole and the substituent is fluorine, chlorine, bromine, lower alkyl or lower alkoxy; and the 4,4', 5 and 5' phenyl groups can be substituted with lower alkyl, lower alkoxy, chlorine, fluorine or bromine; and
the polymerizable monomer is a terminally ethylenically unsaturated addition-polymerizable carboxylic ester.

5. The method of claim 4 wherein the composition contains the chain transfer agent N-phenylglycine.

6. The method of claim 1 wherein
the imaging and fixing is dependent upon a variation in the radiation exposure given the radiation-sensitive material and wherein
both the imaging radiation and the fixing radiation are actinic light radiation, electron beam radiation, or thermal radiation;
the polymerization initiator (3) and the organic oxidant (1)(b) are the same, and
the fixing step (B)(2) comprises irradiating at an exposure of an intensity and for a time sufficient to produce said polymer in a rigidifying amount but insufficient relative to the imaging step radiation exposure to produce said readout product.

7. The method of claim 6 wherein the variation in exposure occurs by a variation in the intensity of the radiation and wherein
the imaging step (B)(1) comprises irradiating with a relatively intense radiation for a time sufficient to activate a relatively large proportion of said organic oxidant, thereby producing an area containing a relatively high, readable concentration of said readout product;

the fixing step (B)(2) comprises irradiating with a fixing radiation substantially less intense than the imaging radiation for producing the readout product but sufficiently intense to substantially completely polymerize the monomer, thereby producing a rigidified area that contains a substantially lesser amount of the readout product than the imaged area and is substantially deactivated against readout product formation when the thus-fixed area is subsequently exposed to the imaging radiation of step (B)(1).

8. The method of claim 6 wherein the variation in exposure occurs by a variation in the time length of the radiation exposure and wherein the imaging and the fixing radiations are sufficiently intense to produce readout product, and where the imaging and fixing exposures differ in that fixing involves irradiating for a shorter time so as to produce a deactivated area containing a lesser amount of the readout product than the imaged area.

9. The method of claim 6 wherein the leucodye is converted to the readout product by oxidation;

the organic oxidant (1)(b) and the polymerization initiator (3) are the same and are a 2,2′,4,4′,5,5′-hexaarylbiimidazole wherein the aryl groups are phenyl, biphenyl, naphthyl, furyl or thienyl; and the polymerizable monomer (2) is a terminally ethylenically unsaturated addition-polymerizable organic monomer.

10. The method of claim 9 wherein the leucodye is selected from the class consisting of aminotriarylmethanes, aminoxanthenes, aminothioxanthenes, amino-9,10-dihydroacridines, aminophenoxazines, aminophenothiazines, aminodihydrophenazines, aminodiphenylmethanes, leucoindamines, aminohydrocinnamic acids (cyano-ethanes, leucomethines), hydrazines, leuco indigoid dyes, amino-2,3-dihydroanthraquinones, phenethylanilines, 10-acyl-aminodihydrophenazines, 10-acyl-aminophenothiazines, 10-acyl-aminophenoxazines and aminotriarylmethanes wherein the methane hydrogen has been replaced by an alkylthio, benzylthio, 2-phenylhydrazino, or alkoyxcarbonyl group; and the 2,2′,4,4′,5,5′-hexaarylbiimidazole is one wherein the aryl groups are carbocylic which can contain, as substituents, chlorine, bromine, fluorine, lower alkyl or lower alkoxy.

11. The method of claim 10 wherein the leucodye is a salt of an acid and an aminotriarylmethane wherein at least two of the aryl groups are phenyl groups having (a) an $R_1R_2N$-substituent in the position para to the bond to the methane carbon atom wherein $R_1$ and $R_2$ are each groups selected from hydrogen $C_1$ to $C_{10}$ alkyl, 2-hydroxyethyl, 2-cyanoethyl, benzyl or phenyl, and (b) a group ortho to the methane carbon atom which is selected from lower alkyl, lower alkoxy, fluorine, chlorine, bromine or butadienylene which when joined to the phenyl group forms a naphthalene ring; and the third aryl group may be the same as or different from the first two, and when different is selected from thienyl, furyl, oxazylyl, thiazolyl, indolyl, benzoxazolyl, benzothiazolyl, phenyl, naphthyl, pyridyl, quinolyl, indolinylidene, or such aforelisted groups, substituted with lower alkyl, lower alkoxy, methylenedioxy, fluoro, chloro, bromo, amino, lower alkylamino, lower dialkylamino, lower alkylthio, hydroxy, carboxy, carbonamido, lower carbalkoxy, lower alkylsulfonyl, lower alkylsulfonamido, $C_6$ to $C_{10}$ arylsulfonamido, nitro or benzylthio;

the hexaarylbiimidazole is a 2,2′,4,4′,5,5′-hexaphenylbiimidazole wherein the 2 and 2′ phenyl groups have a substituent in the position ortho to the carbon of the phenyl group bonded to the biimidazole and the substituent is fluorine, chlorine, bromine, lower alkyl or lower alkoxy; and the 4,4′, 5 and 5′ phenyl groups can be substituted with lower alkyl, lower alkoxy, chlorine, fluorine or bromine; and the polymerizable monomer is a terminally ethylenically unsaturated addition-polymerizable carboxylic ester.

12. The method of claim 11 wherein the composition contains the chain transfer agent N-phenylglycine.

13. The method of claim 9 wherein the imaging and fixing radiation are both actinic light and wherein the imaging radiation is rich in ultraviolet wavelengths.

14.The method of claim 1 wherein the imaging and fixing radiation is actinic radiation and is dependent upon a variation in the wavelength of the radiation in that the imageable composition and the addition-polymerizable monomer are each activated by radiation of a specific wavelength;

the polymerization initiator (3) is activated by radiation of a different wavelength than the imaging radiation and, when so activated, is substantially less effective for producing the readout product than the organic oxidant (1)(b) when it is activated by the imaging radiation, said fixing radiation wavelength being less effective than the imaging radiation for activating the organic oxidant.

15. The method of claim 14 wherein the polymerization initiator (3) is the same as the organic oxidant (1)(b) and has a region of major actinic radiation absorption and a region of minor actinic radiation absorption; and in which imaging involves irradiating into the major region for a time sufficient to produce the readout; while fixing involves irradiating into the minor region only, for a time sufficient to deactivate the composition substantially without readout formation.

16. The method of claim 15 wherein the leucodye is converted to the readout product by oxidation;

the organic oxidant (1) (b) and the polymerization initiator (3) are the same and are a 2,2′,4,4′,5,5′-hexaarylbiimidazole wherein the aryl groups are phenyl, biphenyl, naphthyl, furyl, or thienyl; which have a region of major absorption in the ultraviolet and a region of minor absorption in the visible; and the polymerizable monomer (2) is a terminally ethylenically unsaturated addition-polymerizable organic monomer.

17. The method of claim 16 wherein the leucodye is selected from the class consisting of aminotriarylmethanes, aminoxanthenes, aminothioxanthenes, amino-9,10-dihydroacridines, aminophenoxazines, aminophenothiazines, aminodihydrophenazines, aminodiphenylmethanes, leucoindamines, aminohydrocinnamic acids (cyanoethanes, leucomethines), hydrazines, leucoindigoid dyes, amino-2,3,-dihydroanthraquinones, phenethylanilines, 10-acylaminodihydrophenazines, 10acyl-aminophenothiazines, 10-acylaminophenoxazines and aminotriarylmethanes wherein the methane hydrogen has been replaced by an alkylthio, benzylthio, 2-phenylhydrazino, or alkoxycarbonyl group; and the 2,2′,4,4′,5,5′-hexaarylbiimidazole is one wherein the aryl groups are carbocyclic which can contain, as substituents, chlorine, bromine, fluorine, lower alkyl or lower alkoxy.

18. The method of claim 17 wherein the leucodye is the salt of an acid and an aminotriarylmethane wherein at least two of the aryl groups are phenyl groups having (a) an $R_1R_2N$-substituent in the position para to the bond to the methane carbon atom wherein $R_1$ and $R_2$ are each groups selected from hydrogen, $C_1$ to $C_{10}$ alkyl, 2-hydroxyethyl, 2-cyanoethyl, benzyl or phenyl, and (b) a group ortho to the methane carbon atom which is selected from lower alkyl, lower alkoxy, fluorine, chlorine, bromine or butadienylene which when joined to the phenyl group forms a naphthalene ring; and the third aryl group may be the same as or different from the first two, and when different is selected from thienyl, furyl, oxazylyl, thiazolyl, indolyl, benzoxazolyl, benzothiazolyl, phenyl, naphthyl, pyridyl, quinolyl, indolinylidene, or such aforelisted groups, substituted with lower alkyl, lower alkoxy, methylenedioxy, fluoro, chloro, bromo, amino, lower alkylamino, lower dialkylamino, lower alkylthio, hydroxy, carboxy, carbonamido, lower carbalkoxy, lower alkyl sulfonyl, lower alkylsulfonamido, $C_6$ to $C_{10}$ arylsulfonamido, nitro or benzylthio;

the hexaarylbiimidazole is a 2,2′,4,4′,5,5′-hexaphenylbiimidazole wherein the 2 and 2′ phenyl groups have a substituent in the position ortho to the carbon of the phenyl group bonded to the biimidazole and the substituent is fluorine, chlorine, bromine, lower alkyl or lower alkoxy; and the 4,4′,5 and 5′ phenyl groups can be substituted with lower alkyl, lower alkoxy, chlorine, fluorine or bromine; and the polymerizable monomer is a terminally ethylenically unsaturated addition-polymerizable carboxylic ester.

19. The method of claim 18 wherein the composition contains the claim transfer agent N-phenylglycine.

20. The method of claim 17 wherein the composition contains a visible light sensitizer selected from hydroxyphthalein dyes, acridine dyes, carbocyanine dyes, coumarins, and aminophenylketones, and wherein the imaging step comprises irradiating in the ultraviolet region and the fixing step comprises irradiating in the visible region.

21. The method of claim 13 wherein the polymerization initiator differs from the organic oxidant (1)(b) and has an actinic radiation absorption region that corresponds to nonimaging wavelengths, and the fixing step comprises irradiating at said nonimaging wavelengths.

22 The method of claim 21 wherein the leucodye is converted to the readout product by oxidation;

the organic oxidant (1)(b) is a 2,2′,4,4′,5,5′-hexaarylbiimidazole wherein the aryl groups are phenyl, biphenyl, naphthyl, furyl or thienyl, and which is activated by ultraviolet light imaging radiation;

the polymerizable monomer (2) is a terminally ethylenically unsaturated addition-polymerizable organic monomer; and the polymerization initiator (3) is a polynuclear quinone absorbing principally in the 430–550 $\mu$ region, or a photoreducible visible light-absorbing dye.

23. The method of claim 22 wherein the leucodye is selected from the class consisting of aminotriarylmethanes, aminoxanthenes, aminothioxanthenes, amino-9,10-dihydroacridines, aminophenoxazines, aminophenothiazines, aminodihydrophenazines, aminodiphenylmethanes, leucoindamines, aminohydrophenazines, aminodiphenylmethanes, leucoindamines, aminohydrocinnamic acids (cyanoethanes, leucomethines), hydrazines, leucoindigoid dyes, amino-2,3-dihydroanthraquinones, phenethylanilines, 10-acylaminodihydrophenazines, 10-acyl-aminophenothiazines, 10-acyl-aminophenoxazines and aminotriarylmethanes wherein the methane hydrogen has been replaced by an alkylthio, benzylthio, 2-phenylhydrazino, or alkoxycarbonyl group; and the 2,2′,4,4′,5,5′-hexaarylbiimidazole is one wherein the aryl groups are carbocyclic which can contain, as substituents, chlorine, bromine, fluorine, lower alkyl or lower alkoxy.

24. The method of claim 23 wherein the leucodye is the salt of an acid and an aminotriarylmethane wherein at least two of the aryl groups are phenyl groups having (a) an $R_1R_2N$-substituent in the position para to the bond to the methane carbon atom wherein $R_1$ and $R_2$ are each groups selected from hydrogen, $C_1$ to $C_{10}$ alkyl, 2-hydroxyethyl, 2-cyanoethyl, benzyl or phenyl, and (b) a group ortho to the methane carbon atom which is selected from lower alkyl, lower alkoxy, fluorine, chlorine, bromine or butadienylene (which alkoxy, fluorine, chlorine, bromine or butadieneylene) which when joined to the phenyl group forms a naphthalene ring; and the third aryl group may be the same as or different from the first two, and when different is selected from thienyl, furyl, oxazylyl, thiazolyl, indolyl, benzoxazolyl, benzothiazolyl, phenyl, naphthyl pyridyl, quinolyl, indolinylidene, or such aforelisted groups substituted with lower alkyl, lower alkoxy, methylenedioxy, fluoro, chloro, bromo, amino, lower alkylamino, lower dialkylamino, lower alkylthio, hydroxy, carboxy, carbonamido, lower carbalkoxy, lower alkyl sulfonyl, lower alkyl sulfonamido, $C_6$ to $C_{10}$ arylsulfonamido, nitro or benzylthio;

the hexaarylbiimidazole is a 2,2′,4,4′,5,5′-hexaphenylbiimidazole wherein the 2 and 2′ phenyl groups have a substituent in the position ortho to the carbon of the phenyl group bonded to the biimidazole and the substituent is fluorine, chlorine, bromine, lower alkyl or lower alkoxy; and the 4,4′, 5 and 5′ phenyl groups can be substituted with lower alkyl, lower alkoxy, chlorine, fluorine or bromine; and the polymerizable monomer is a terminally ethylenically unsaturated addition-polymerizable carboxylic ester.

25. The method of claim 24 wherein the composition contains a claim transfer agent which is capable of reducing the polymerization initiator upon irradiation.

26 The method of claim 4 wherein the radiation-sensitive image recording material comprises 2,2′-(o-chlorophenyl)-4,4′,5,5′-tetrakis(m-methoxyphenyl)biimidazole, tri(N,N-diethylamino-o-tolyl)methane, p-toluene sulfonic acid, N-phenyl glycine, triethylene glycol diacrylate and cellulose acetate butyrate.

27. The method of claim 26 wherein the image-recording material contains additionally a compound selected from 3,3′-diethyl selenacarbocyanine iodide and 3,6-bis(diethylamino)acridine hydrochloride, and 3,6-bis(dimethylamino)acridine hydrochloride.

* * * * *